(12) United States Patent
Hofmeister et al.

(10) Patent No.: US 7,575,406 B2
(45) Date of Patent: Aug. 18, 2009

(54) SUBSTRATE PROCESSING APPARATUS

(75) Inventors: Christopher Hofmeister, Hampstead, NH (US); Robert T. Caveney, Windham, NH (US)

(73) Assignee: Brooks Automation, Inc., Chelmsford, MA (US)

( * ) Notice: Subject to any disclaimer, the term of this patent is extended or adjusted under 35 U.S.C. 154(b) by 1127 days.

(21) Appl. No.: 10/624,987

(22) Filed: Jul. 22, 2003

(65) Prior Publication Data

US 2004/0151562 A1   Aug. 5, 2004

Related U.S. Application Data

(60) Provisional application No. 60/397,895, filed on Jul. 22, 2002.

(51) Int. Cl.
| | | |
|---|---|---|
| *H01L 21/677* | (2006.01) | |
| *B65H 1/00* | (2006.01) | |
| *B65F 9/00* | (2006.01) | |
| *B65G 67/00* | (2006.01) | |
| *A01D 90/00* | (2006.01) | |
| *B65G 67/02* | (2006.01) | |

(52) U.S. Cl. .............. 414/217; 414/222.01; 414/396; 414/401; 414/584; 414/935; 198/619; 204/298.25

(58) Field of Classification Search .............. 414/217, 414/939
See application file for complete search history.

(56) References Cited

U.S. PATENT DOCUMENTS

| | | | | |
|---|---|---|---|---|
| 4,624,617 A | | 11/1986 | Belna ..................... 414/347 |
| 4,766,993 A | * | 8/1988 | Kita et al. ................ 198/619 |
| 5,086,729 A | * | 2/1992 | Katagiri ................. 118/729 |
| 5,275,709 A | | 1/1994 | Anderle et al. ......... 204/298.25 |
| 5,309,049 A | * | 5/1994 | Kawada et al. ............ 310/12 |
| 5,417,537 A | | 5/1995 | Miller .................... 414/217 |
| 5,571,325 A | | 11/1996 | Ueyama et al. ........... 118/320 |
| 5,641,054 A | * | 6/1997 | Mori et al. ............... 198/619 |
| 5,655,277 A | | 8/1997 | Galdos et al. ............. 29/33 P |

(Continued)

FOREIGN PATENT DOCUMENTS

EP   EP 1 365 040   11/2003

(Continued)

OTHER PUBLICATIONS

Patent Abstracts of Japan, No. 2004040089, filed May 21, 2003, Evers et al.

*Primary Examiner*—Gregory W Adams
(74) *Attorney, Agent, or Firm*—Perman & Green, LLP; Richard Pickreign

(57) ABSTRACT

A semiconductor workpiece processing apparatus having a first chamber, a transport vehicle, and another chamber. The first chamber is capable of being isolated from an outside atmosphere. The transport vehicle is located in the first chamber and is movably supported from the first chamber for moving linearly relative to the first chamber. The transport vehicle includes a base, and an integral semiconductor workpiece transfer arm movably mounted to the base and capable of multi-access movement relative to the base. The other chamber is communicably connected to the first chamber via a closable opening of the first chamber. The opening is sized to allow the transport vehicle to transit between the first chamber and the other chamber through the opening.

38 Claims, 29 Drawing Sheets

U.S. PATENT DOCUMENTS

| | | | | |
|---|---|---|---|---|
| 5,700,127 | A * | 12/1997 | Harada et al. | 414/416.08 |
| 5,846,328 | A | 12/1998 | Aruga et al. | 118/718 |
| 6,206,176 | B1 * | 3/2001 | Blonigan et al. | 198/619 |
| 6,235,634 | B1 * | 5/2001 | White et al. | 438/680 |
| 6,238,161 | B1 * | 5/2001 | Kirkpatrick et al. | 414/217 |
| 6,288,366 | B1 | 9/2001 | Dings | 219/388 |
| 6,297,611 | B1 | 10/2001 | Todorov et al. | 318/568.21 |
| 6,318,951 | B1 | 11/2001 | Schmidt et al. | 414/744.5 |
| 6,361,268 | B1 | 3/2002 | Pelrine et al. | 414/749.2 |
| 6,468,021 | B1 | 10/2002 | Bonora et al. | 414/522 |
| 6,471,459 | B2 | 10/2002 | Blonigan et al. | 414/217 |
| 6,483,222 | B2 | 11/2002 | Pelrine et al. | 310/268 |
| 6,503,365 | B1 | 1/2003 | Kim et al. | 156/345.32 |
| 6,517,303 | B1 * | 2/2003 | White et al. | 414/217 |
| 6,540,896 | B1 | 4/2003 | Saeki et al. | 145/345.31 |
| 6,641,350 | B2 | 11/2003 | Nakashima et al. | 414/217 |
| 2001/0026748 | A1 | 10/2001 | Blonigan et al. | 414/217 |
| 2002/0044860 | A1 * | 4/2002 | Hayashi et al. | 414/416.03 |
| 2002/0061248 | A1 * | 5/2002 | Tepman | 414/744.5 |
| 2002/0089237 | A1 | 7/2002 | Hazelton | 310/12 |
| 2002/0144881 | A1 * | 10/2002 | Miyauchi et al. | 198/619 |
| 2002/0150448 | A1 * | 10/2002 | Mizokawa et al. | 414/217 |
| 2002/0192056 | A1 | 12/2002 | Reimer et al. | 414/941 |
| 2003/0129045 | A1 | 7/2003 | Bonora et al. | 414/217 |

FOREIGN PATENT DOCUMENTS

| | | |
|---|---|---|
| WO | WO99/23504 | 5/1999 |
| WO | WO99/33691 | 7/1999 |
| WO | WO99/59190 | 11/1999 |
| WO | WO99/59928 | 11/1999 |
| WO | WO99/60611 | 11/1999 |
| WO | WO99/61350 | 12/1999 |
| WO | WO00/68974 | 11/2000 |
| WO | WO01/02211 | 1/2001 |
| WO | WO01/22477 | 3/2001 |
| WO | WO01/38124 | 5/2001 |
| WO | WO01/71684 | 9/2001 |
| WO | WO02/051728 | 7/2002 |
| WO | WO02/099854 | 12/2002 |
| WO | WO03/038869 | 5/2003 |

* cited by examiner

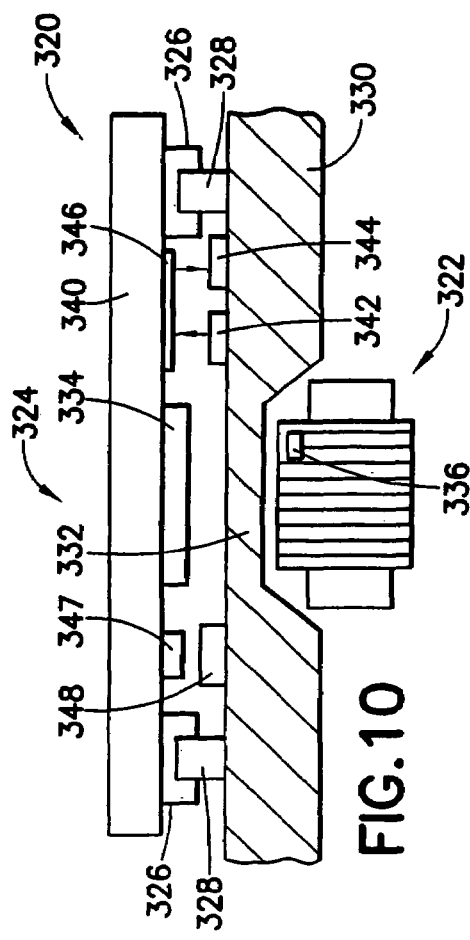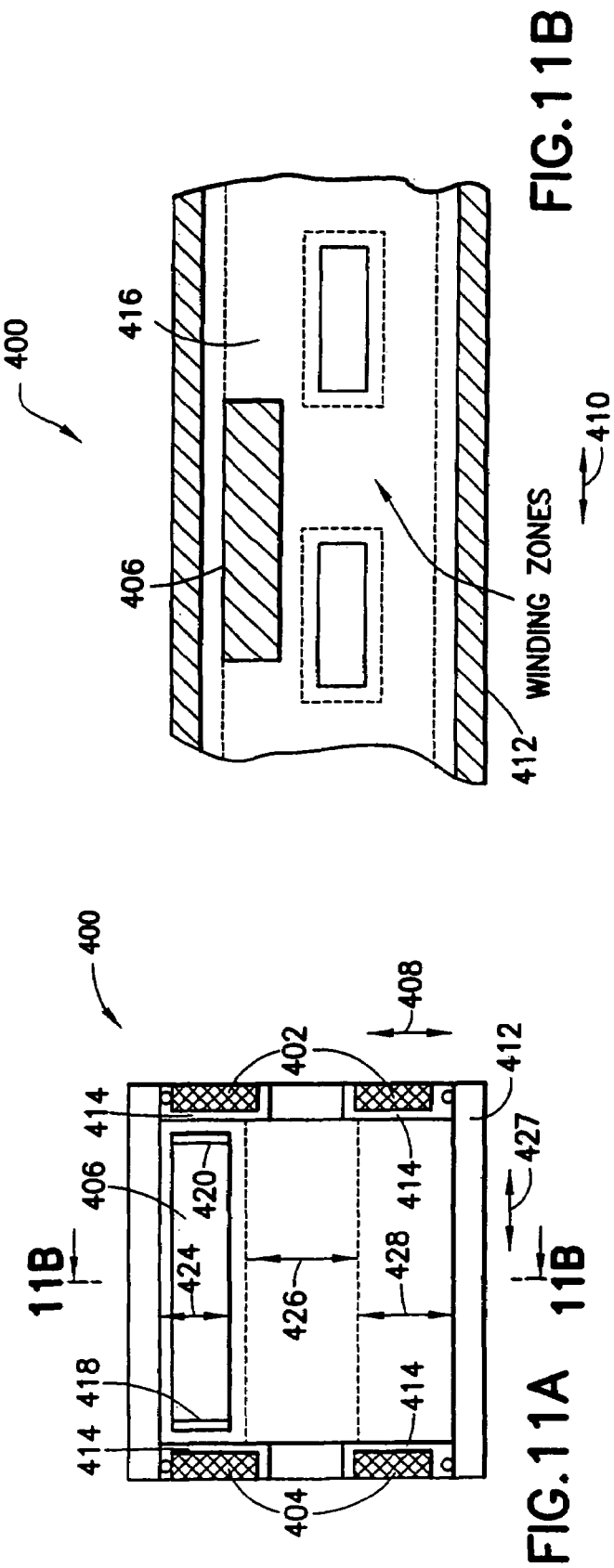

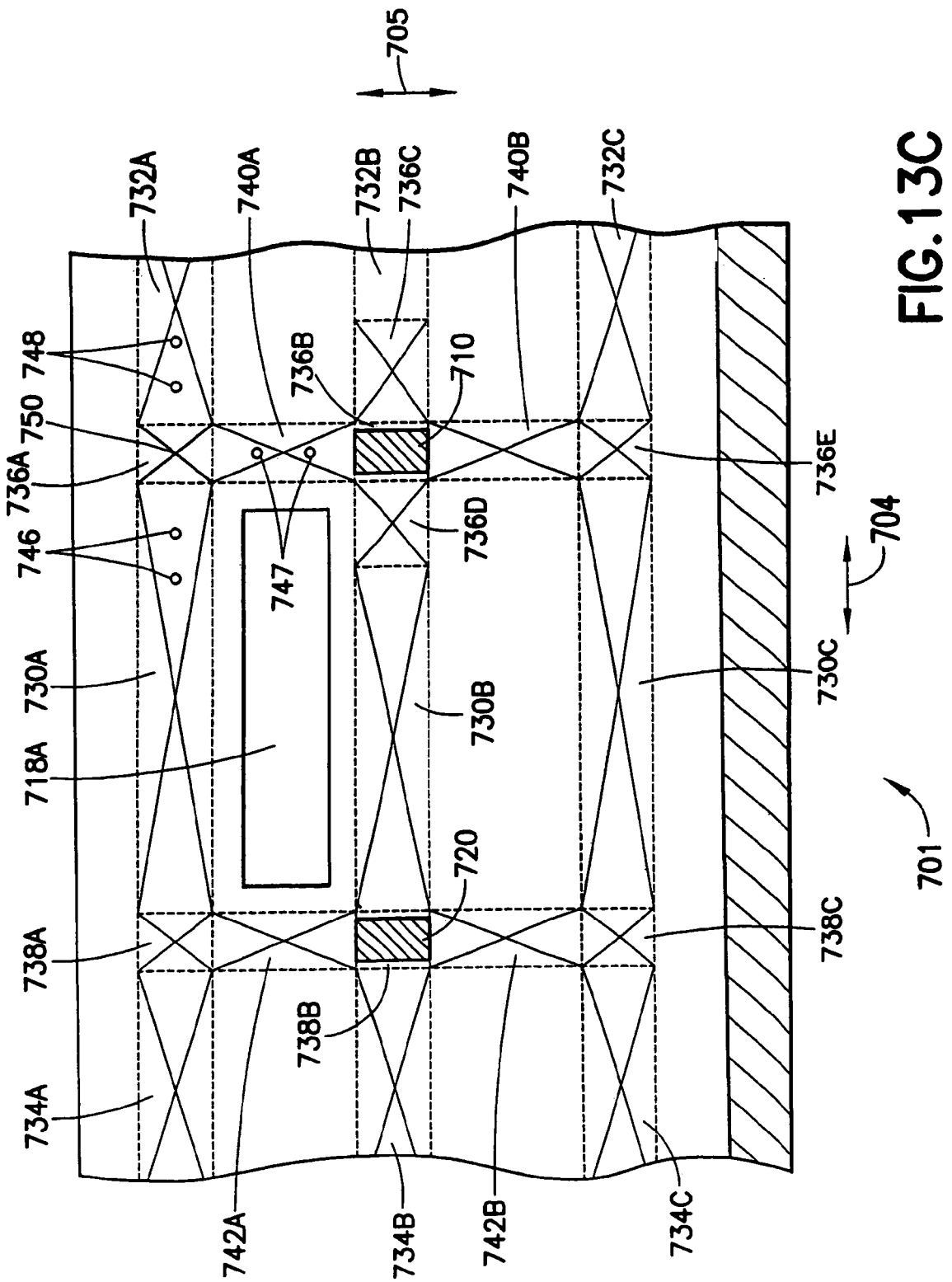

SUBSTRATE PROCESSING APPARATUS

CROSS-REFERENCE TO RELATED APPLICATION(S)

This application claims the benefit of U.S. Provisional Application No. 60/397,895, filed Jul. 22, 2002, which is incorporated by reference herein in its entirety.

BACKGROUND INFORMATION

1. Field

The embodiments and methods described herein relate to substrate processing apparatus and, more particularly, to substrate processing apparatus with chambers interconnected in a Cartesian arrangement.

2. Brief Description of Earlier Developments

One of the factors affecting consumer desire for new electronic devices naturally is the price of the device. Conversely, if the cost, and hence the price of new electronic devices can be lowered, it would appear that a beneficial effect would be achieved in consumer desires for new electronic devices. A significant portion of the manufacturing costs for electronic devices is the cost of producing the electronics which starts with the manufacturing and processing of semi-conductor substrates such as used in manufacturing electronic components, or panels used for making displays. The cost of processing substrates is affected in part by the cost of the processing apparatus, the cost of the facilities in which the processing apparatus are housed, and in large part by the throughput of the processing apparatus (which has significant impact on unit price). As can be immediately realized, the size of the processing apparatus itself impacts all of the aforementioned factors. However, it appears that conventional processing apparatus have reached a dead end with respect to size reduction. Moreover, conventional processing apparatus appear to have reached a limit with respect to increasing throughput per unit. For example, conventional processing apparatus may use a radial processing module arrangement. A schematic plan view of a conventional substrate processing apparatus is shown in FIG. 1. As can been seen, the processing modules of the apparatus in FIG. 1 are placed radially around the transport chamber of the processing apparatus. The transport apparatus, which is a conventional two or three axis of movement apparatus (e.g. Z, θ, T Axis) is centrally located in the transport chamber to transport substrates between processing modules. As can be realized from FIG. 1, throughput of the conventional processing apparatus is limited by the handling rate of the transport apparatus. In other words, throughput cannot be increased with the conventional apparatus by merely adding processing modules to the apparatus, because once the transport apparatus reaches a handling rate peak, this becomes the controlling factor for throughput. The apparatus of the present invention overcome the problems of the prior art as will be described further below.

SUMMARY OF THE EMBODIMENTS AND METHODS

In accordance with the first embodiment, a substrate processing apparatus is provided. The apparatus comprises a transport chamber, at least one substrate holding module for holding a substrate, a transport vehicle, and another module. The transport chamber is capable of having a controlled atmosphere therein. The at least one substrate holding module is communicably connected to the transport chamber for allowing transfer of the substrate between the at least one holding module and the transport chamber. The transport vehicle is movably mounted in the transport chamber. The vehicle has a base and a substrate transfer arm that is movably jointed and movably mounted to the base. The other module is capable of holding the substrate and is communicably connected to the transport chamber for transferring the chamber to the substrate therebetween. The transport chamber defines a linear travel slot for the vehicle. The at least one holding module is located on one side of the slot, and the arm has articulation for moving a substrate to opposite sides of the slot. This allows the other module to be selectively connected to the transport chamber on either side of the slot. The transport vehicle can effect transfer of the substrate between the transport chamber and both the holding module and the other module.

In accordance with another embodiment, a substrate processing apparatus is provided. The apparatus comprises a linear transport chamber, at least one processing module for processing a substrate, another module, and a transport vehicle. The linear transport chamber is capable of having a controlled atmosphere therein. The chamber has substrate transfer openings. The processing module is communicably connected to a side of the chamber for allowing transfer, through the transfer openings, of the substrate between the at least one processing module and the transport chamber. The other module is capable of holding the substrate therein. The other module is selectively connected to either the same side of the chamber as the at least one processing module or to an opposite side of the chamber. The transfer vehicle is movably mounted in the chamber to travel linearly in the transport chamber. The vehicle has a base and a jointed substrate transfer arm movably mounted to the base. The transfer arm has a reach so that the vehicle is capable of transferring the substrate between the transfer chamber and both the at least one processing module and the other module. The chamber has at least one of the minimum chamber width or a minimum substrate transfer opening width for the given reach of the vehicle substrate arm.

In accordance with another embodiment, a semiconductor workpiece processing apparatus is provided. The apparatus comprises a first chamber, a transport vehicle, and another chamber. The first chamber is capable of being isolated from an outside atmosphere. The transport vehicle is located in the first chamber and is movably supported from the first chamber for moving linearly relative to the first chamber. The transport vehicle includes a base and an integral semiconductor workpiece transfer arm movably mounted to the base and capable of multi-access movement relative to the base. The other chamber is communicably connected to the first chamber via a closable opening of the first chamber. The opening is sized to allow the transport vehicle to transit between the first chamber and the other chamber through the opening.

In accordance with yet another embodiment, a substrate processing apparatus is provided. The apparatus comprises a transport chamber, at least one substrate holding module for holding a substrate, a first transport vehicle, and a second transport vehicle. The transport chamber is capable of having a controlled atmosphere therein. The at least one substrate holding module is communicably connected to the transport chamber for allowing transfer of the substrate between the at least one holding module and transport chamber. The first transport vehicle is movably mounted in the transport chamber. The first vehicle has a first movable substrate transfer arm adapted for moving the substrate between the transport chamber and the at least one substrate holding module. The second transfer vehicle is movably mounted in the transport chamber. The second vehicle has a second movable substrate transfer arm adapted for moving the substrate between the transport chamber and the at least one substrate holding module. The transport chamber has several linear travel paths for the first and second vehicles to travel in the transport chamber. The first and second vehicles are capable of moving past one another when the first vehicle is using one of the travel paths and the second vehicle is using another of the travel paths.

BRIEF DESCRIPTION OF THE DRAWINGS

The foregoing aspects and other features of the present invention are explained in the following description, taken in connection with the accompanying drawings, wherein:

FIG. 10 is an end view of a platen drive system of the substrate processing apparatus;

FIGS. 11A-11B are respectively an end view, and a section view (taken along lines 11B-11B in FIG. 11A) of another platen drive system of the substrate processing apparatus;

FIGS. 13B-13C respectively are a section view of the chamber and cart taken along lines 13B-13B in FIG. 13A, and another section view taken along lines 13C-13C in FIG. 13B;

DETAILED DESCRIPTION OF THE EMBODIMENTS

Figure 2:
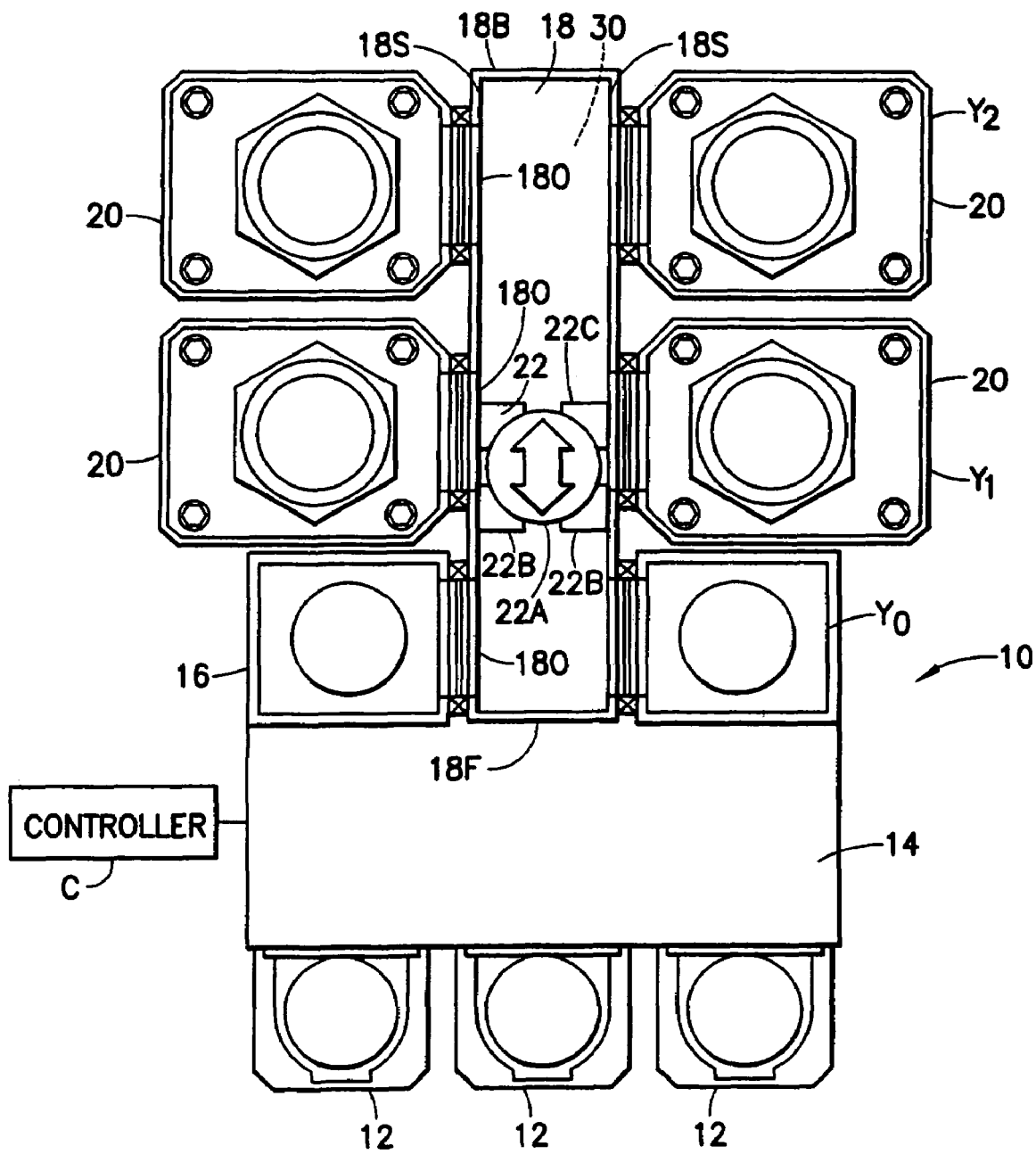
FIG. 2 is a schematic plan view of a substrate processing apparatus incorporating features of the present invention in accordance with a first embodiment.

Referring to FIG. 2, there is shown a schematic plan view of a substrate processing apparatus 10 incorporating features of the present invention. Although the present invention will be described with reference to the embodiments shown in the drawings, it should be understood that the present invention can be embodied in many alternate forms of embodiments. In addition, any suitable size, shape or type of elements or materials could be used.

The substrate processing apparatus 10 is connected to an environmental front end module (EFEM) 14 which has a number of load ports 12 as shown in FIG. 2. The load ports 12 are capable of supporting a number of substrate storage canisters such as for example conventional FOUP canisters; though any other suitable type ma be provided. The EFEM 14 communicates with the processing apparatus through load locks 16 which are connected to the processing apparatus as will be described further below. The EFEM 14 (which may be open to atmosphere) has a substrate transport apparatus (not shown) capable of transporting substrates from load ports 12 to load locks 16. The EFEM 14 may further include substrate alignment capability, batch handling capability, substrate and carrier identification capability or otherwise. In alternate embodiments, the load locks 16 may interface directly with the load ports 12 as in the case where the load locks have batch handling capability or in the case where the load locks have the ability to transfer wafers directly from the FOUP to the lock. Some examples of such apparatus are disclosed in U.S. Pat. Nos. 6,071,059, 6,375,403, 6,461,094, 5,588,789, 5,613,821, 5,607,276, 5,644,925, 5,954,472, 6,120,229 and U.S. patent application Ser. No. 10/200,818 filed Jul. 22, 2002 all of which are incorporated by reference herein in their entirety. In alternate embodiments, other lock options may be provided.

Figure 1:
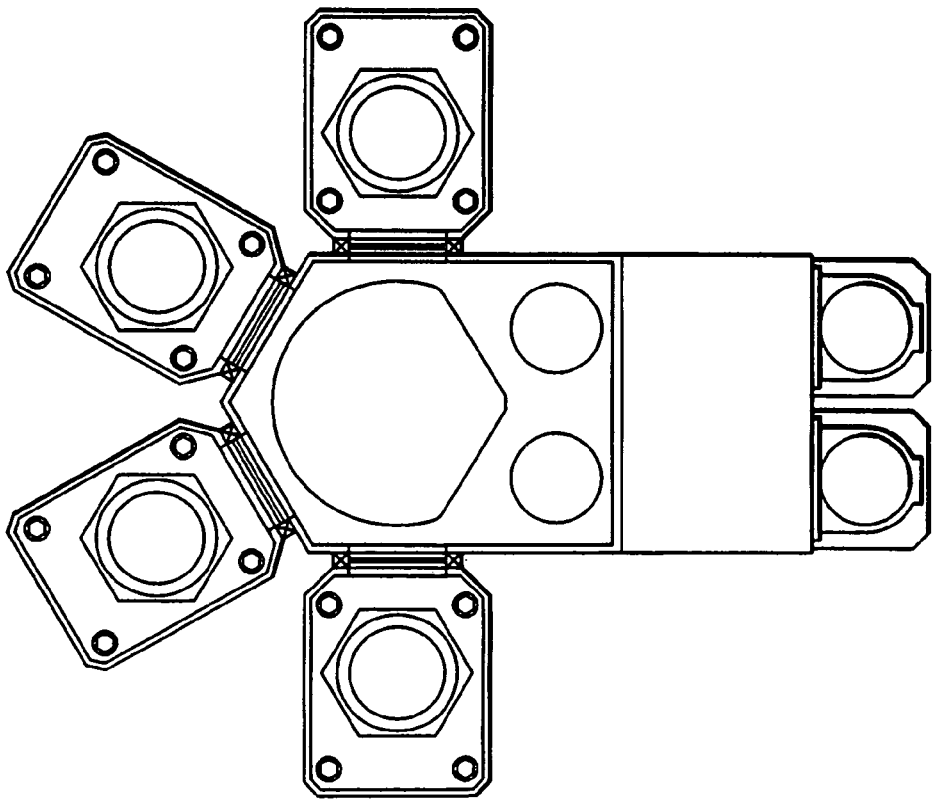
FIG. 1 is a schematic plan view of a substrate processing apparatus in accordance with the prior art.
Figure 4:
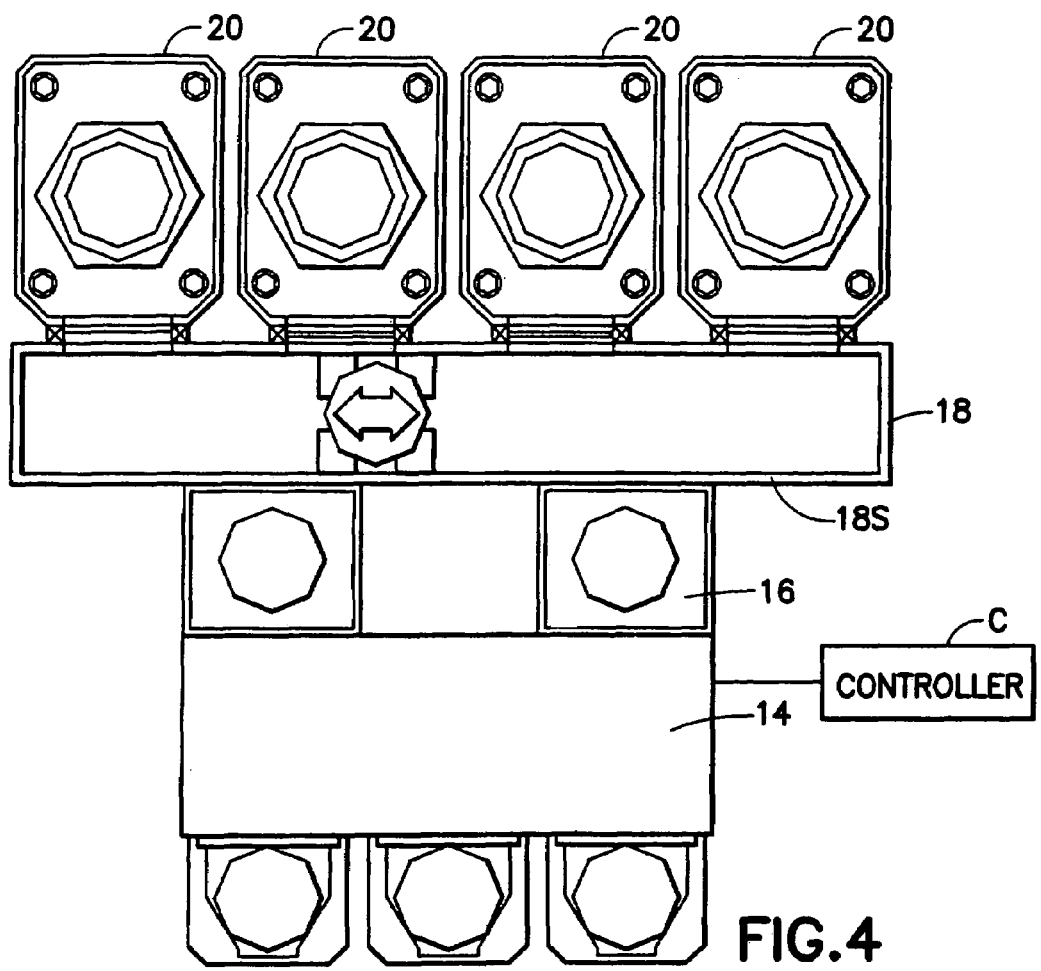
FIGS. 4-5 are respectively schematic plan views of substrate processing apparatus in accordance with still other embodiments of the present invention.
Figure 5:
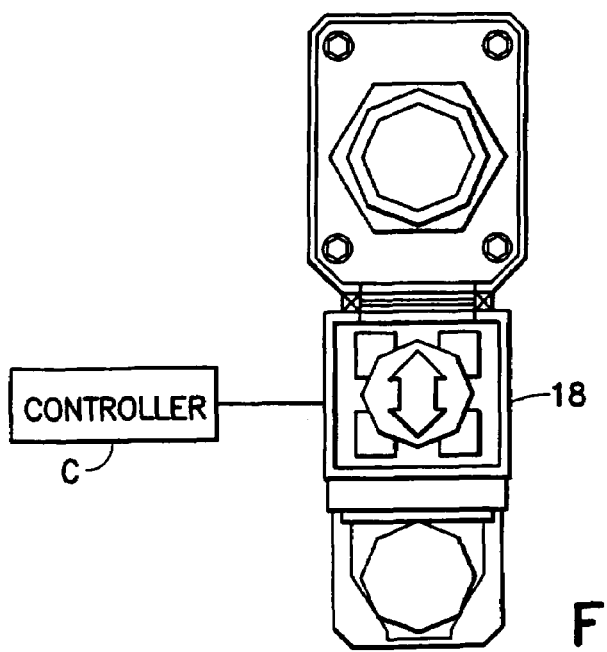

Still referring to FIG. 2, the processing apparatus 10, which as noted before may be used for processing semiconductor substrates (e.g. 200/300 mm wafers), panels for flat panel displays, or any other desired kind of substrate, generally comprises transport chamber 18, processing modules 20, and at least one substrate transport apparatus 22. The substrate transport apparatus 22 in the embodiment shown is integrated with the chamber 18. In this embodiment, processing modules are mounted on both sides of the chamber. In other embodiments, processing modules may be mounted on one side of the chamber as shown for example in FIG. 4. In the embodiment shown in FIG. 2, processing modules 20 are mounted opposite each other in rows Y1, Y2 or vertical planes. In other alternate embodiments, the processing modules may be staggered from each other on the opposite sides of the transport chamber or stacked in a vertical direction relative to each other. The transport apparatus 22 has a cart 22C that is moved in the chamber to transport substrates between load locks 16 and the processing chambers 20. In the embodiment shown, only one cart 22C is provided, in alternate embodiments, more carts may be provided. As seen in FIG. 2, the transport chamber 18 (which is subjected to vacuum or an inert atmosphere or simply a clean environment or a combination thereof in its interior) has a configuration, and employs a novel substrate transport apparatus 22 that allows the processing modules to be mounted to the chamber 18 in a novel Cartesian arrangement with modules arrayed in substantially parallel vertical planes or rows. This results in the processing apparatus 10 having a more compact footprint than a comparable conventional processing apparatus (i.e. a conventional processing apparatus with the same number of processing modules) as is apparent from comparing FIGS. 1 and 2. Moreover, the transport chamber 22 may be capable of being provided with any desired length to add any desired number of processing modules, as will be described in greater detail below, in order to increase throughput. The transport chamber may also be capable of supporting any desired number of transport apparatus therein and allowing the transport apparatus to reach any desired processing chamber on the transport chamber without interfering with each other. This in effect decouples the throughput of the processing apparatus from the handling capacity of the transport apparatus, and hence the processing apparatus throughput becomes processing limited rather than handling limited. Accordingly, throughput can be increased as desired by adding processing modules and corresponding handling capacity on the same platform.

Still referring to FIG. 2, the transport chamber 18 in this embodiment has a general rectangular shape though in alternate embodiments the chamber may have any other suitable shape. The chamber 18 has a slender shape (i.e. length much longer than width) and defines a generally linear transport path for the transport apparatus therein. The chamber 18 has longitudinal side walls 18S. The side walls 18S have transport openings or ports 18O formed therethrough. The transport ports 18O are sized large enough to allow substrates to pass through the ports (can be through valves) into and out of the transport chamber. As can be seen in FIG. 2, the processing modules 20 in this embodiment are mounted outside the side walls 18s with each processing module being aligned with a corresponding transport port in the transport chamber. As can be realized, each processing module 20 may be sealed against the sides 18S of the chamber 18 around the periphery of the corresponding transport aperture to maintain the vacuum in the transport chamber. Each processing module may have a valve, controlled by any suitable means to close the transport port when desired. The transport ports 18O may be located in the same horizontal plane. Accordingly, the processing modules on the chamber are also aligned in the same horizontal plane. In alternate embodiments the transport ports may be disposed in different horizontal planes. As seen in FIG. 2, in this embodiment, the load locks 16 are mounted to the chamber sides 18S at the two front most transport ports 18O. This allows the load locks to be adjacent the EFEM 14 at the front of the processing apparatus. In alternate embodiments, the load locks may be located at any other transport ports on the transport chamber such as shown for example in FIG. 4. The hexahedron shape of the transport chamber allows the length of the chamber to be selected as desired in order to mount as many rows of processing modules as desired (for example see FIGS. 3, 5, 6-7A showing other embodiments in which the transport chamber length is such to accommodate any number of processing modules).

As noted before, the transport chamber 18 in the embodiment shown in FIG. 2 has one substrate transport apparatus 22 having a single cart 22C. The transport apparatus 22 is integrated with the chamber to translate cart 22C back and forth in the chamber between front 18F and back 18B. The transport apparatus 22 has cart 22C having end effectors for holding one or more substrates. The cart 22C of transport apparatus 22 also has an articulated arm or movable transfer mechanism 22A for extending and retracting the end effectors in order to pick or release substrates in the processing modules or load locks. To pick or release substrates from the processing modules/load ports, the transport apparatus 22 may be aligned with desired module/port and the arm is extended/retracted through the corresponding port 18O to position the end effector inside the module/port for the substrate pick/release.

The transport apparatus 22, shown in FIG. 2 is a representative transport apparatus and, includes a cart 22C which is supported from linear support/drive rails. The transport apparatus will be described in greater detail below. The linear support/drive rails may be mounted to the side walls 18S, floor, or top of the transport chamber and may extend the length of the chamber. This allows the cart 22C, and hence, the apparatus to traverse the length of the chamber. The cart has a frame, which supports the arm. The frame also supports caster mounts or platens 22B, which move with or relative to the frame. As will also be described further below, a sequential synchronous linear motor 30 drives the platens 22B and hence the cart 22C along the rails. The linear motor 30 may be located in the floor or side walls 18S of the transport chamber. A barrier, as will be seen further below, may be located between the windings of the motor and the motive portion of the platens to isolate the windings from the interior of the chamber. In general, the linear motor may include a number of drive zones. The drive zones are located at locations along the transport chamber where the arm 22A is extended/retracted (i.e. at the rows Y0-Y2 in this embodiment of modules/ports). The number, and density of drive zones is dependent on the number of platens per cart, the number of motors per chamber, the number of process modules or exchange points etc. In this embodiment, the arm is operably connected to the platens 22A by a suitable linkage/transmission so that when the platens are moved by a drive motor in relative motion to each other the arm is extended or retracted. For instance, the transmission may be arranged so that when the platens are moved apart along the rails the arm is extended to the left, and when moved back closer together the arm is retracted from the left. The platens may also be suitably operated by a linear motor to extend/retract the arm 22A to/from the right. The control of movement of the platens over the slide rails with the linear motor, as well as position sensing of the platens and hence of the cart and the extended/retracted position of the arm may be accomplished in accordance with international application having publication numbers WO 99/23504; 99/33691; 01/02211; 01/38124; and 01/71684, which are incorporated by reference herein in their entireties. As can be realized, the platens may be driven in unison in one direction in order to move the entire cart/apparatus in that longitudinal direction inside the transport chamber.

Figure 3:
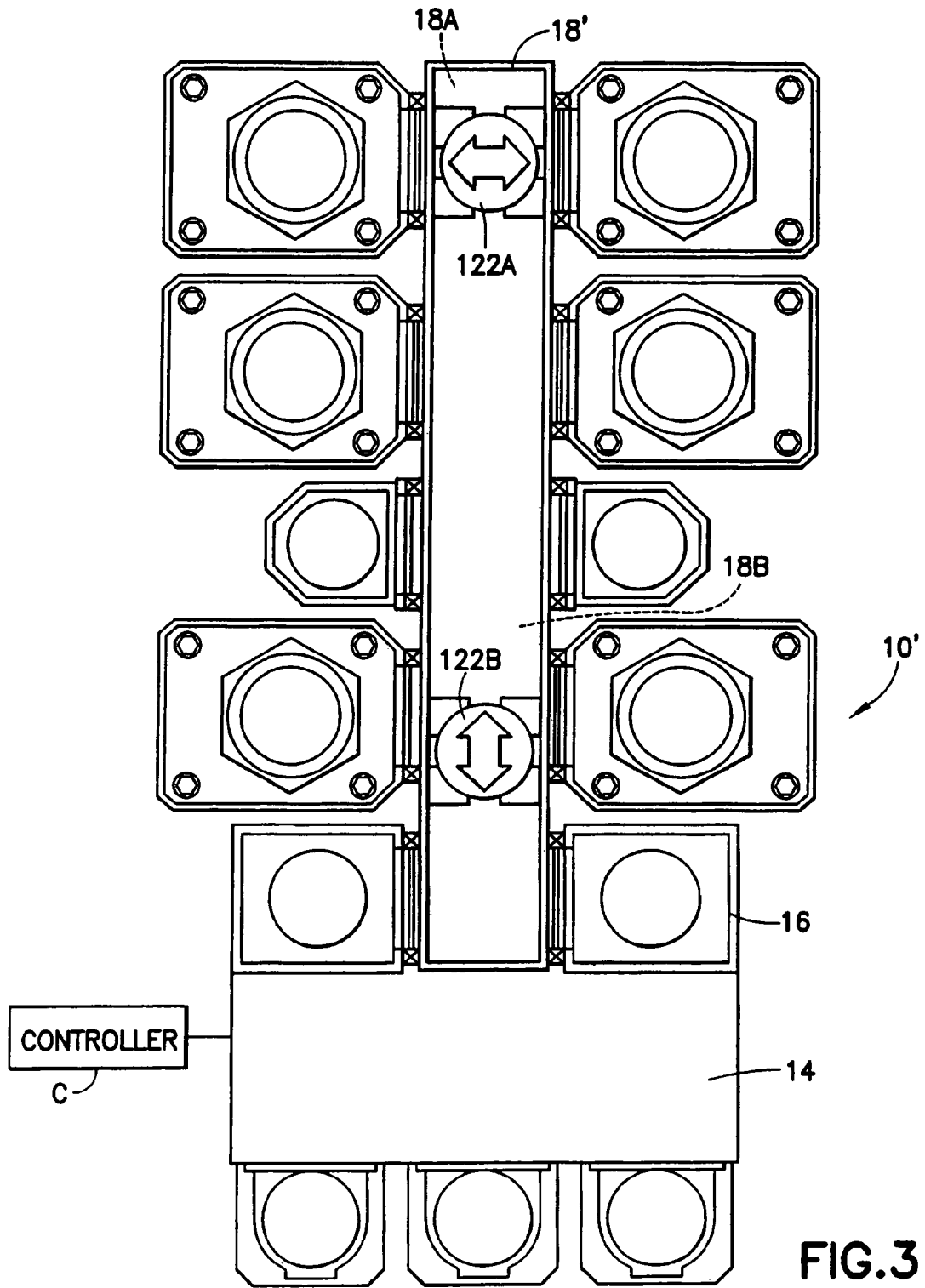
FIG. 3 is a schematic plan view of a substrate processing apparatus in accordance with another embodiment of the present invention.

FIG. 3 shows another embodiment of a substrate processing apparatus 10' which is generally similar to apparatus 10. In this embodiment, the transport chamber 18' has two transport apparatus 22A, 22B. The transport apparatus 122A, 122B are substantially the same as the apparatus 22 in the previously described embodiment. Both transport apparatus 122A, 122B may be supported from a common set of longitudinal slide rails as described before. The platens of the cart corresponding to each apparatus may be driven by the same linear motor drive. The different drive zones of the linear motor allow the independent driving of individual platens on each cart and thus also the independent driving of each individual cart 122A, 122B. Thus, as can be realized the arm of each apparatus can be independently extended/retracted using the linear motor in a manner similar to that described before. However, in this case the substrate transport apparatus 122A, 122B are not capable of passing each other in the transport chamber unless separate slide systems are employed. Accordingly, the processing modules are positioned along the length of the transport chamber so that the substrate may be transported to be processed in the processing module in a sequence which would avoid the transport apparatus from interfering with each other. For example, processing modules for coating may be located before heating modules, and cooling modules and etching modules may be located last.

However, the transport chamber 18' may have another transport zone 18'A, 18'B which allow the two transport apparatus to pass over each other (akin to a side rail, bypass rail or magnetically suspended zone that does not require rails). In this case, the other transport zone may be located either above or below the horizontal plane(s) in which the processing modules are located. In this embodiment the transport apparatus has two slide rails, one for each transport apparatus. One slide rail may be located in the floor, or side walls of the transport chamber, and the other slide rail may be located in the top of the chamber. In alternate embodiments, a linear drive system may be employed which simultaneously drives and suspends the carts where the carts may be horizontally and vertically independently moveable, hence allowing them independent of each other to pass or transfer substrates. In all embodiments employing electric windings, these windings may also be used as resistance heaters as in the case where it is desired that the chamber be heated for degas as in the case to eliminate water vapor for example. Each transport apparatus in this case may be driven by a dedicated linear drive motor or a dedicated drive zone in which the cart resides similar to that described before.

Figure 6:
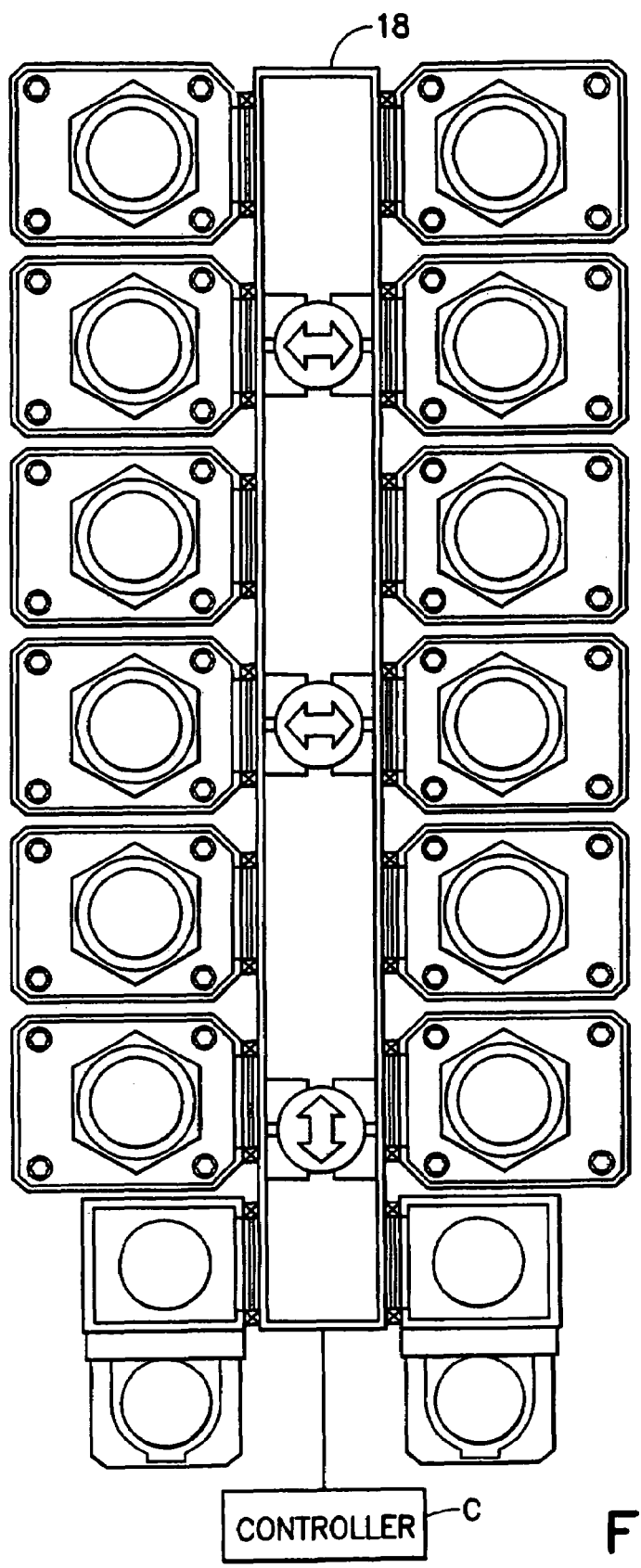
FIG. 6 is a schematic plan view of a substrate processing apparatus in accordance with yet another embodiment of the present invention.
Figure 7:
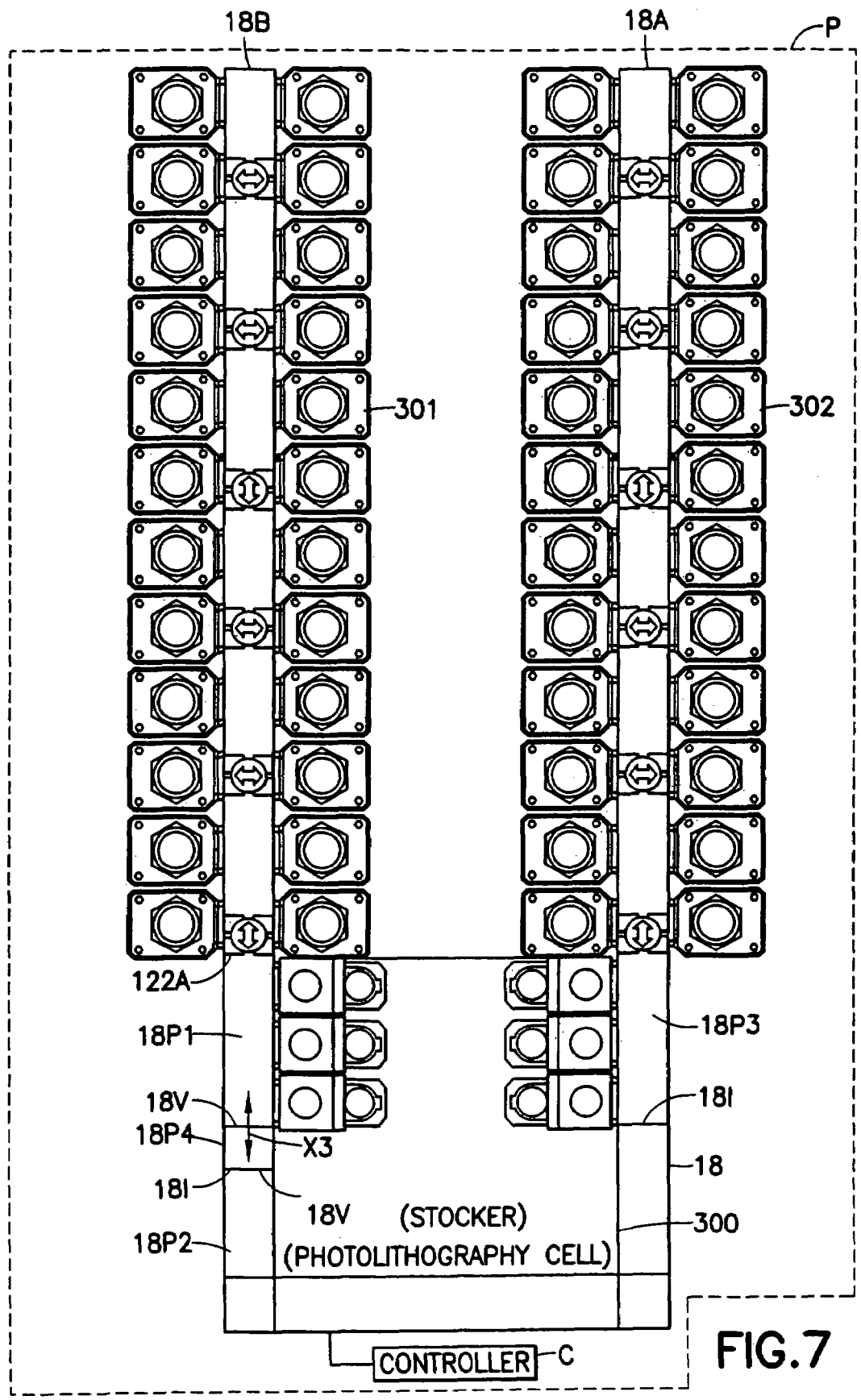
FIG. 7 is a schematic plan view of a substrate processing system with two substrate processing apparatus in accordance with another embodiment.

Referring now to FIGS. 6, and 7 there are shown other substrate processing apparatus in accordance with other embodiments of the present invention. As seen in FIGS. 6 and 7 the transport chamber in these embodiments is elongated to accommodate additional processing modules. The apparatus shown in FIG. 6 has twelve (12) processing modules connected to the transport chamber, and each apparatus (two apparatus are shown) in FIG. 7 has 24 processing module connected to the transport chamber. The numbers of processing modules shown in these embodiments are merely exemplary, and the apparatus may have any other number of processing modules as previously described. The processing modules in these embodiments are disposed along the sides of the transport chamber in a Cartesian arrangement similar to that previously discussed. The number of rows of processing modules in these case however have been greatly increased (e.g. six (6) rows in the apparatus of FIG. 6, and twelve (12) rows in each of the apparatus of FIG. 7) In the embodiment of FIG. 6, the EFEM may be removed and the load ports may be mated directly to load locks. The transport chamber of the apparatus in FIGS. 6, and 7 have multiple transport apparatus (i.e. three apparatus in the case of FIG. 6, and six apparatus in the case of FIG. 7) to handle the substrates between the load locks and the processing chambers. The number of transport apparatus shown are merely exemplary and more or fewer apparatus may be used. The transport apparatus in these embodiments are generally similar to that previously described, comprising an arm and a cart. In this case, however, the cart is supported from zoned linear motor drives in the side walls of the transport chamber. The linear motor drives in this case provide for translation of the cart in two orthogonal axis (i.e. longitudinally in the transport chamber and vertically in the transport chamber). Accordingly, the transport apparatus are capable of moving past one another in the transport chamber. The transport chamber may have "passing" or transport areas above and/or below the plane(s) of the processing modules, through which the transport apparatus may be routed to avoid stationary transport apparatus (i.e. picking/releasing substrates in the processing modules) or transport apparatus moving in opposite directions. As can be realized, the substrate transport apparatus has a controller for controlling the movements of the multiple substrate transport apparatus.

Still referring to FIG. 7, the substrate processing apparatus 18A and 18B in this case may be mated directly to a tool 300.

As may be realized from FIGS. 3, 5 and 6-7 the transport chamber 18 may be extended as desired to run throughout the processing facility P. As seen in FIG. 7, and as will be described in further detail below, the transport chamber may connect and communicate with various sections or bays, 18A, 18B in the processing facility P such as for example storage, lithography tool, metal deposition tool or any other, suitable tool bays. Bays interconnected by the transport chamber 18 may also be configured as process bays or processes 18A, 18B. Each bay has desired tools (e.g. lithography, metal deposition, heat soaking, cleaning) to accomplish a given fabrication process in the semiconductor workpiece. In either case, the transport chamber 18 has processing modules, corresponding to the various tools in the facility bays, communicably connected thereto, as previously described, to allow transfer of the semiconductor workpiece between chamber and processing modules. Hence, the transport chamber may contain different environmental conditions such as atmospheric, vacuum, ultra high vacuum, inert gas, or any other, throughout its length corresponding to the environments of the various processing modules connected to the transport chamber. Accordingly, the section 18P1 of the chamber in a given process or bay 18A, 18B, or within a portion of the bay, may have for example, one environmental condition (e.g. atmospheric), and another section 18P2, 18P3 of the chamber may have a different environmental condition. As noted before, the section 18P1, 18P2, 18P3 of the chamber with different environments therein may be in different bays of the facility, or may all be in one bay of the facility. FIG. 7 shows the chamber 18 having three sections 18P1, 18P2, 18P3 with different environments for example purposes only. The chamber 18 in this embodiment may have as many sections with as many different environments as desired.

As seen in FIG. 7, the transport apparatus, similar to apparatus 122A, (see also FIG. 3) in the chamber 18 are capable of transiting between sections 18P1, 18P2, 18P3 of the chamber with different environments therein. Hence, as can be realized from FIG. 7, the transport apparatus 122A may with one pick move a semiconductor workpiece from the tool in one process or bay 18A of the processing facility to another tool with a different environment in a different process or bay 18B of the process facility. For example, transport apparatus 122A may pick a substrate in processing module 301, which may be an atmospheric module, lithography, etching or any other desired processing module in section 18P1, of transport chamber 18. The transport apparatus 122A may then move in the direction indicated by arrow X3 in FIG. 7 from section 18P1 of the chamber to section 18P3. In section 18P3, the transport apparatus 122A may place the substrate in processing module 302, which may be any desired processing module.

As can be realized from FIG. 7, the transport chamber may be modular, with chamber modules connected as desired to form the chamber 18. The modules may include internal walls 18I, similar to walls 18F, 18R in FIG. 2, to segregate sections 18P1, 18P2, 18P3, 18P4 of the chamber. Internal walls 18I may include slot valves, or any other suitable valve allowing one section of the chamber 18P1, 18P4 to communicate with adjoining section. The slot valves 18V, may be sized to allow, one or more carts to transit through the valves from one section 18P1, 18P4 to another. In this way, the carts 122A may move anywhere throughout the chamber 18. The valves may be closed to isolate sections 18P1, 18P2, 18P3, 18P4 of the chamber so that the different sections may contain disparate environments as described before. Further, the internal walls of the chamber modules may be located to form load locks 18P4 as shown in FIG. 2. The load locks 18P4 (only one is shown in FIG. 2 for example purposes) may be located in chamber 18 as desired and may hold any desired number of carts 122A therein.

Figure 9:
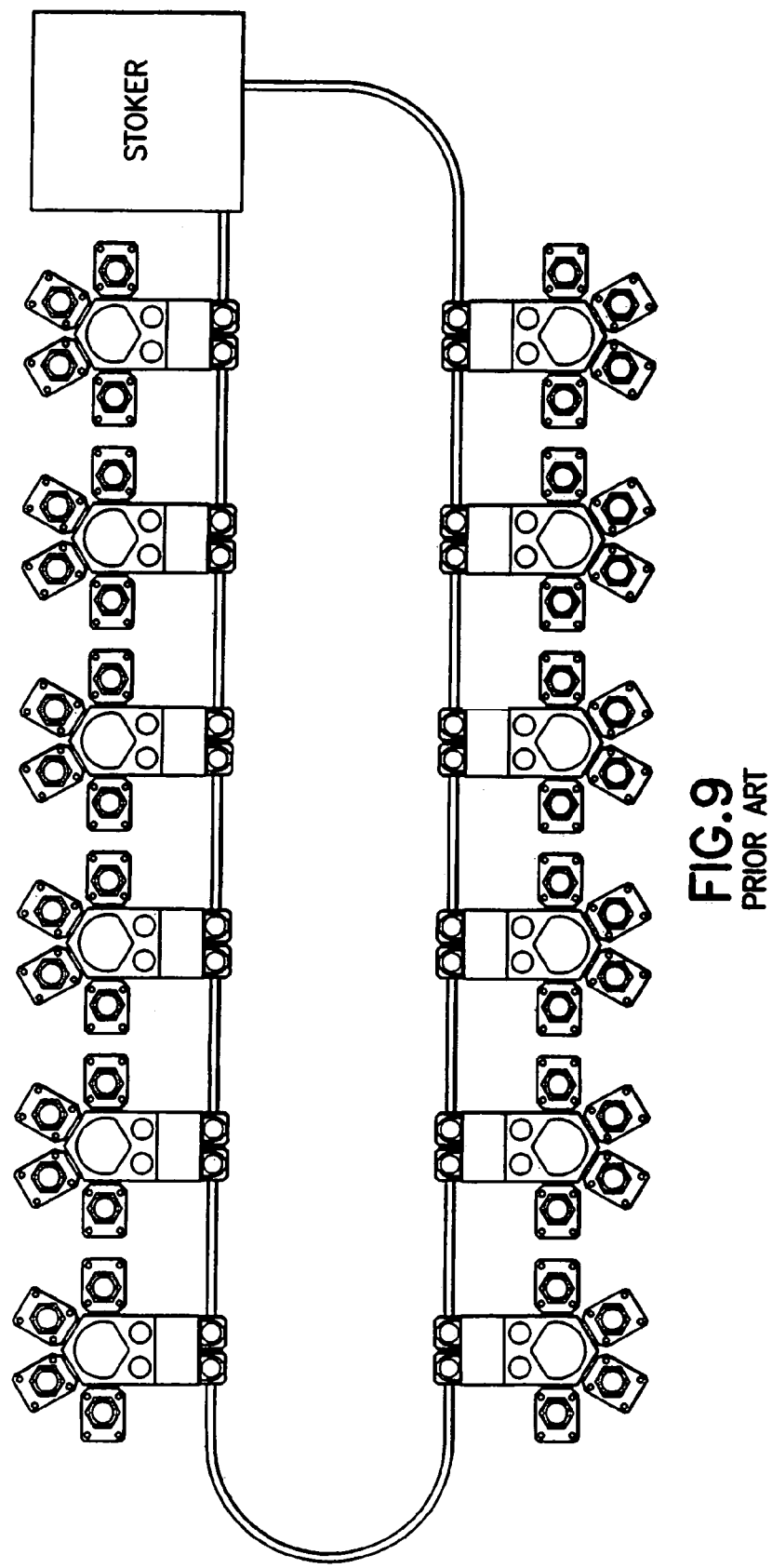
FIG. 9 is a schematic plan view of a conventional substrate processing system including a number of conventional processing apparatus and a stocker.

In the embodiment shown in FIG. 7, processes 18A and 18B may be the same process, for example etch, where the processing apparatus 18A and 18B in combination with tool 300 being a stocker are capable of processing equal amounts of substrates as, for example the apparatus shown in FIG. 9 but without the associated material handling overhead associated with transporting FOUPS from the stocker to individual process tools via an AMHS, and transporting individual wafers via EFEM's to the respective processing tools. Instead, the robot within the stocker directly transfers FOUPS to the load ports (3 shown per tool, more or less could be provided depending on throughput requirements) where the wafers are batch moved into locks and dispatched to their respective process module(s) depending on the desired process and/or throughput required. In this manner, in a steady state fashion, the FIG. 7 apparatus and FIG. 9 apparatus may have the same throughput, but the apparatus in FIG. 7 does it with less cost, lower footprint, less WIP required—therefor less inventory and with a quicker turnaround when looking at the time to process a single carrier lot (or "hot lot") resulting in significant advantages for the fab operator. Within the tool 18A, 18B or the stocker 300 may further have metrology capability, sorting capability, material identification capability, test capability, inspection capability (put boxes etc. as required to effectively process and test substrates.

Figure 8:
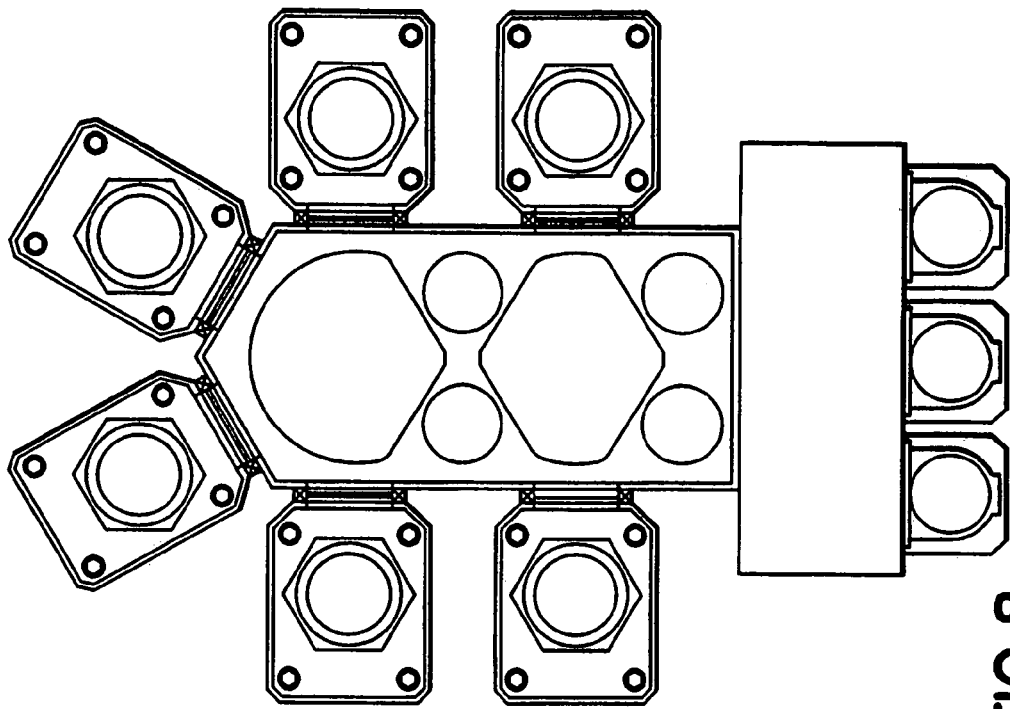
FIG. 8 is a schematic plan view of another conventional substrate processing apparatus.
Figure 7A:
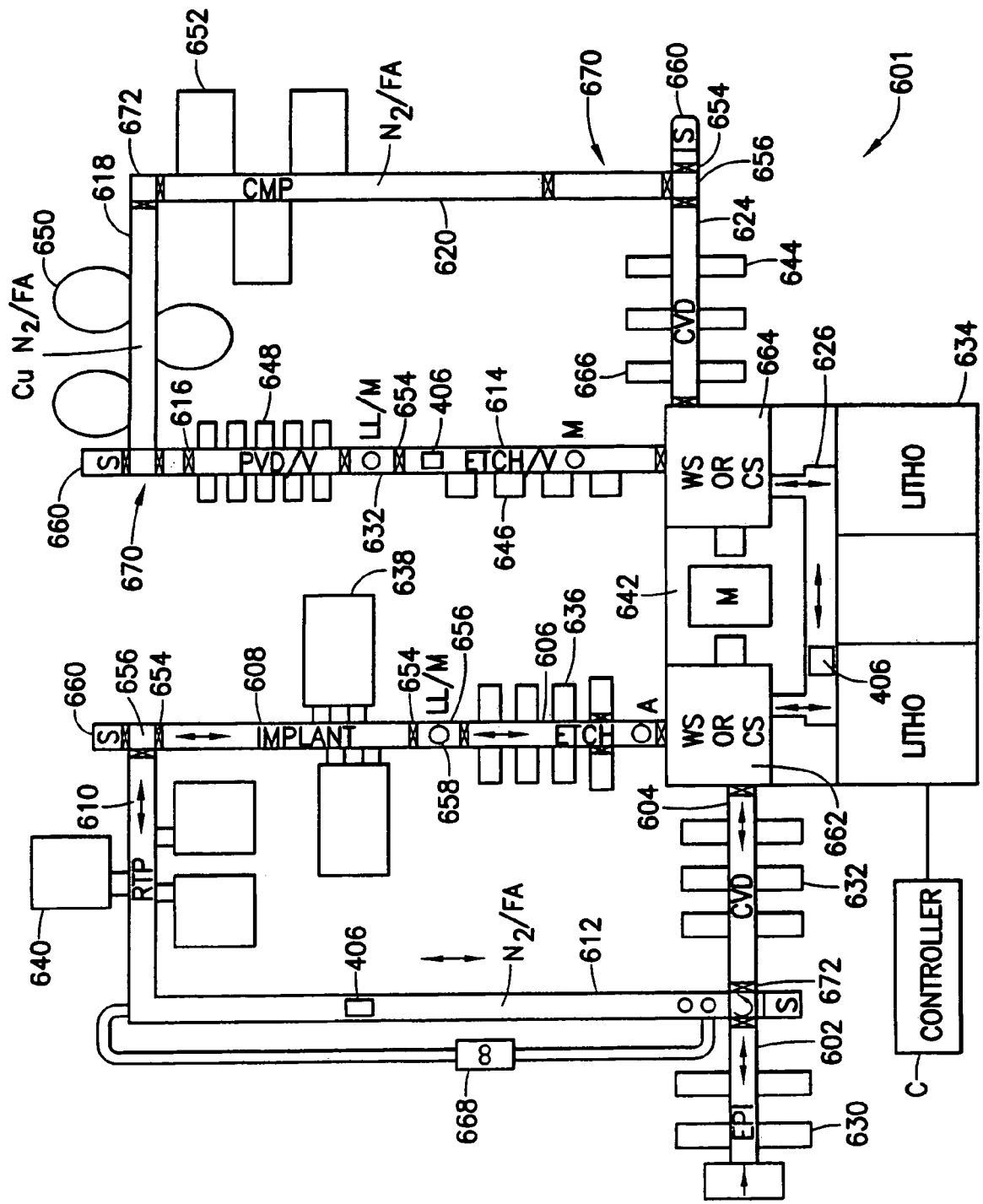
FIG. 7A is another schematic plan view of the substrate processing system in accordance with yet another embodiment.

In the embodiment shown in FIG. 7, more or less processes 18A and 18B may be provided that are different processes, for example etch, CMP, copper deposition, PVD, CVD, etc. where the processing apparatus 18A, 18B, etc. in combination with tool 300 being, for example a photolithography cell are capable of processing equal amounts of substrates as, for example multiple apparatus' shown in FIG. 9 but without the associated material handling overhead associated with transporting FOUPs from stockers to individual process tool bays and a lithography bay via an AMHS, and transporting individual wafers via EFEM's to the respective processing tools. Instead, the automation within the lithography cell directly transfers FOUPS, substrates or material to the load ports (3 shown per process type, more or less could be provided depending on throughput requirements) where the substrates are dispatched to their respective process depending on the desired process and/or throughput required. An example of such an alternative is shown in FIG. 7A. In this manner, the apparatus in FIG. 7 processes substrates with less cost, lower footprint, less WIP required—therefor less inventory and with a quicker turnaround when looking at the time to process a single carrier lot (or "hot lot"), and with a higher degree of contamination control resulting in significant advantages for the fab operator. Within the tool 18A, 18B or the tool or cell 300 may further have metrology capability, processing capability, sorting capability, material identification capability, test capability, inspection capability (put boxes . . . ) etc . . . as required to effectively process and test substrates. As can be realized from FIG. 7, the processing apparatus 18A, 18B, and tool 300 may be coupled to share a common controller environment (e.g. inert atmosphere, or vacuum). This ensures that substrates remain in a controlled environment from tool 300 and throughout the process in apparatus 18A, 18B. This eliminates use of special environment controls of the FOUPs as in conventional apparatus configuration shown in FIG. 8.

Referring now to FIG. 7A, there is shown an exemplary fabrication facility layout 601 incorporating features of the embodiment shown in FIG. 7. Carts 406, similar to carts 22A, 122A transport substrates or wafers through process steps within the fabrication facility 601 through transport chambers 602, 604, 606, 608, 610, 612, 614, 616, 618, 620, 624, 626. Process steps may include epitaxial silicon 630, dielectric deposition 632, photolithography 634, etching 636, ion implantation 638, rapid thermal processing 640, metrology 642, dielectric deposition 644, etching 646, metal deposition 648, electroplating 650, chemical mechanical polishing 652. In alternate embodiments, more or less processes may be involved or mixed; such as etch, metal deposition, heating and cooling operations in the same sequence. As noted before, carts 406 may be capable of carrying a single wafer or multiple wafers and may have transfer capability, such as in the case where cart 406 has the capability to pick a processed wafer and place an unprocessed wafer at the same module. Carts 406 may travel through isolation valves 654 for direct tool to tool or bay to bay transfer or process to process transfer. Valves 654 may be sealed valves or simply conductance type valves depending upon the pressure differential or gas species difference on either side of a given valve 654. In this manner, wafers or substrates may be transferred from one process step to the next with a single handling step or "one touch". As a result, contamination due to handling is minimized. Examples of such pressure or species difference could be for example, clean air on one side and nitrogen on the other; or roughing pressure vacuum levels on one side and high vacuum on the other; or vacuum on one side and nitrogen on the other. Load locks 656, similar to chambers 184P4 in FIG. 7, may be used to transition between one environment and another; for example between vacuum and nitrogen or argon. In alternate embodiments, other pressures or species may be provided in any number of combinations. Load locks 656 may be capable of transitioning a single carrier or multiple carriers. Alternately, substrate(s) may be transferred into load lock 656 on shelves (not shown) or otherwise where the cart is not desired to pass through the valve. Additional features 658 such as alignment modules, metrology modules, cleaning modules, process modules (ex: etch, deposition, polish etc . . . ), thermal conditioning modules or otherwise, may be incorporated in lock 656 or the transport chambers. Service ports 660 may be provided to remove carts or wafers from the tool. Wafer or carrier stockers 662, 664 may be provided to store and buffer process and or test wafers. In alternate embodiments, stockers 662, 664 may not be provided, such as where carts are directed to lithography tools directly. Another example is where indexer or wafer storage module 666 is provided on the tool set. Re-circulation unit 668 may be provided to circulate and or filter air or the gas species in any given section such as tool section 612. Re-circulation unit 668 may have a gas purge, particle filters, chemical filters, temperature control, humidity control or other features to condition the gas species being processed. In a given tool section more or less circulation and or filter or conditioning units may be provided. Isolation stages 670 may be provided to isolate carts and/or wafers from different process' or tool sections that can not be cross contaminated. Locks or interconnects 672 may be provided to change cart orientation or direction in the event the cart may pick or place within a generic workspace without an orientation change. In alternate embodiments or methods any suitable combination of process sequences or make up could be provided.

Referring now to FIG. 10, there is shown an end view of an exemplary single axis platen drive system 320 in accordance with one embodiment. Drive system 320 is an example of a drive suitable for driving transport apparatus or carts 22A, 122A, 406 shown in FIGS. 2, 3, and 7-7A. System 320 has a stationary winding set which drives platen 324. Platen 324 may be supported on slide blocks 326 which are slideable on rails 328. Rails 328 are coupled to a base 330, or side walls, of the transport chamber. Base 330 provides a barrier 332 between winding 322 and platen 324. As can be realized, barrier 332 may also isolate the winding 322 from the interior environment of the chamber. Winding 322 is coupled to base 330. Platen may have magnets 334 coupled to it for interfacing the platen 324 with winding 322. A sensor 336 may be a magneto-restrictive type hall effect sensor and may be provided for sensing the presence of the magnets in platen 324 and determining proper commutation. Additionally, sensors 336 may be employed for fine position determination of platen 324. Position feedback device 340 may be provided for accurate position feedback. Device 340 may be inductive or optical for example. In the instance where it is inductive, an excitation source 342 may be provided which excites winding or pattern 346 and inductively couples back to receiver 344 via coupling between pattern 346. The relative phase and amplitude relationship used for determining the location of platen 324. A cart identification tag 347, such as an IR tag may be provided with a reader 348 provided at appropriate stations to determine cart id by station.

Referring now to FIG. 11A, there is shown an end view of platen drive system 400 in accordance with another embodiment. Referring also to FIG. 11B, there is shown a section view of drive system 400, taken along lines 11B-11B in FIG. 11A. As will be described further below, system 400 is capable of effecting movement of a platen or cart 406 (cart 406 may be similar to carts or transport apparatus 22A, 122A described before). System 400 has opposing stationary winding sets 402, 404 which drive cart 406. Winding sets 402, 404 are wound in a two dimensional driving array, vertical 408 and lateral 410. In alternate embodiments, additional arrays could be provided to drive cart 406 in different directions, for example 427 by coupling system 400 to another similar system oriented 90 degrees therefrom. The arrays are driven in multiple zones in order to allow multiple carts to be driven independently. As an example, zone 424 could be a supply zone, zone 426 could be a transfer zone, and zone 428 could be a return zone. Within each zone may be sub-zones which allow driving multiple carts within each zone. In alternate embodiments, more or less zones or sub-zones may be provided in any of a number of combinations. Cart 406 is supported by the fields produced by winding sets 402, 404 and is positionable in a non-contact manner by biasing the fields between winding sets 402 and 406. Chamber 412 may be provided as a barrier 414 between winding sets 402, 404 and cart 406. Windings exist in zone 416 as shown. Cart 406 may have platens 418, 420 with the windings. In alternate embodiments, more or less platens may be provided. Arrays of sensors may be provided for sensing the presence of the magnets in the platens or the cart or the platens for determining proper commutation and location and for fine position determination of the platens and the carte. A cart identification tag may be provided with a reader provided at appropriate stations to determine cart id by station.

Figure 12:
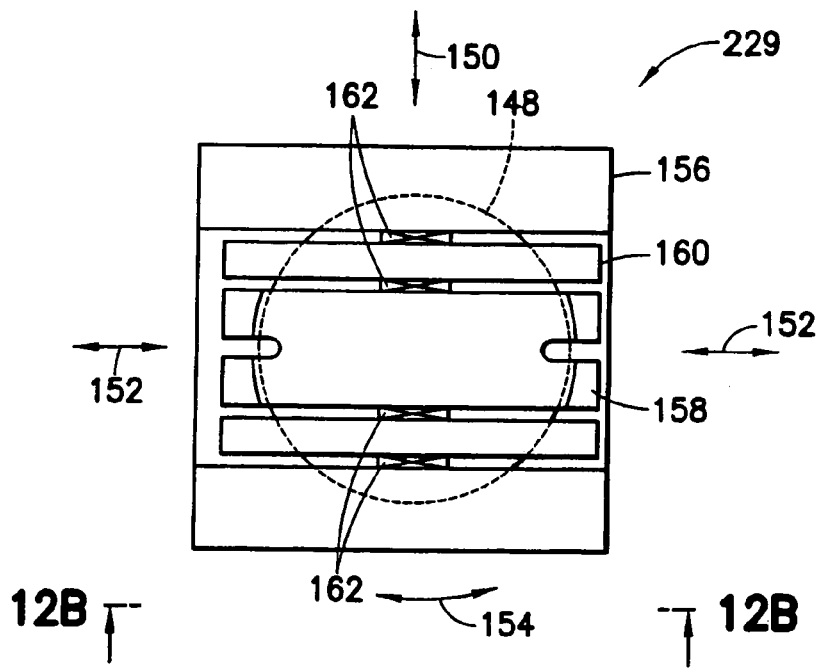
FIG. 12 is a top view of an exemplary cart of the substrate processing apparatus in accordance with another embodiment of the apparatus.

Referring now to FIG. 12, there is shown a top view of an exemplary cart 229 for the processing apparatus 10 in accordance with another embodiment of the apparatus. Cart 229 may be similar to carts 22, 122A, 406 described before and shown in FIGS. 2, 3, and 7-7A. Cart 229 is shown as being capable of transporting substrate 148 along an axial path 150 and/or a radial path 152. The cart 229 is also capable of moving the substrate along path 154 shown in FIG. 12. Cart 229 is shown as a two dimensional system for simplicity, however in alternate embodiments additional axis of motion, for example, z motion (not shown—in and out of paper) or angular motion 154 could be provided. Cart 229 is shown as being capable of handling a single substrate 148 for simplicity. However, in alternate embodiments, additional handling could be provided. For example, the cart may include capability to handle a second substrate, as in the case where it is desired that a substrate be exchanged at a process module (i.e. a first, processed substrate may be picked and a second unprocessed substrate may then be placed at the same process module from the same cart 229).

Figure 17:
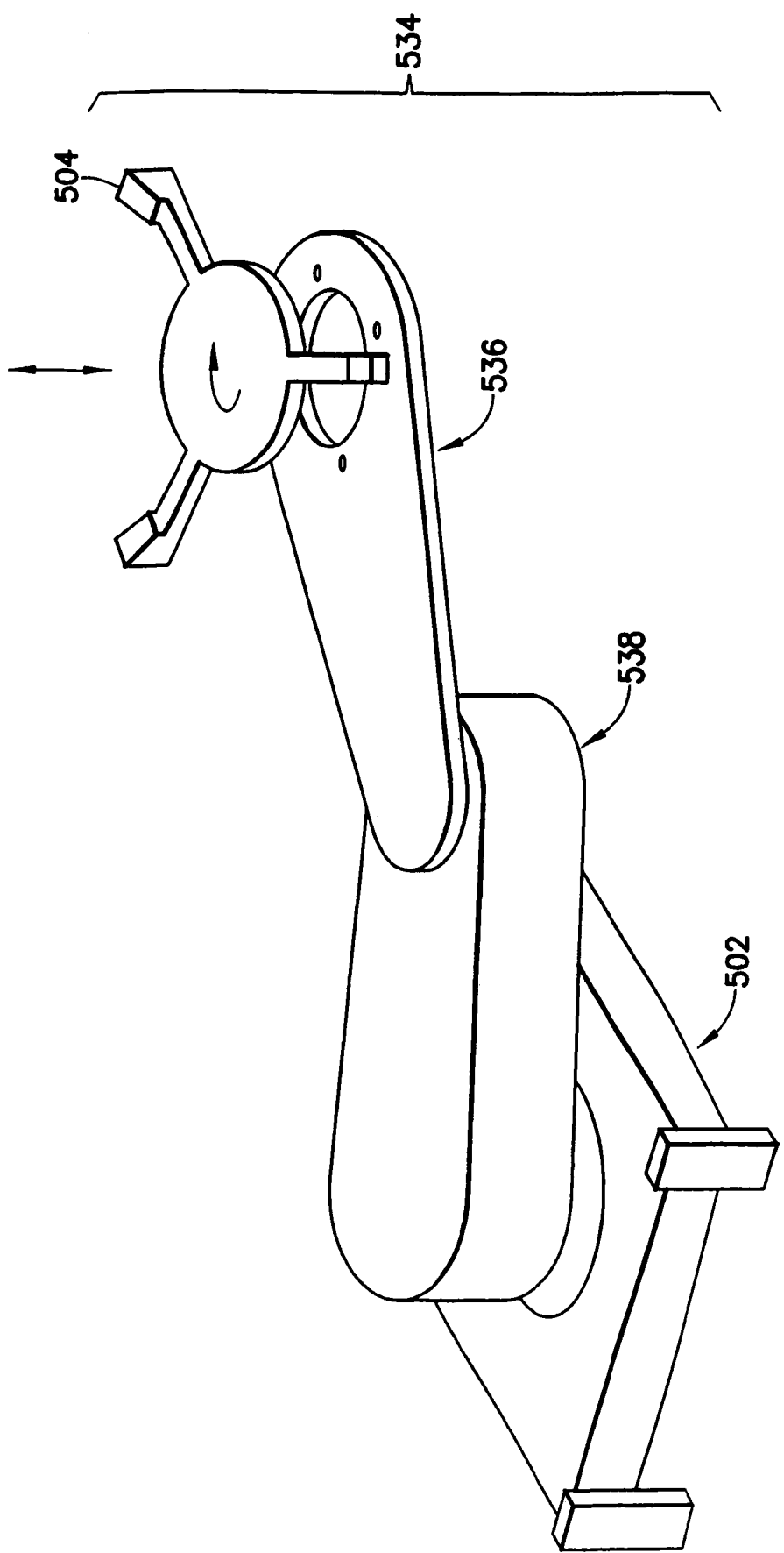
FIG. 17 is a schematic perspective view of the transport cart in accordance with another embodiment.

Cart 229 has frame 156, end effector 158 and secondary frame 160. Slides 162 constrain frame 156, end effector 158 and secondary frame 160 to be slideable relative to each other along linear path 152 either to the left or right of frame 156 as shown. Although a linear mechanism is shown, in alternate embodiments, any suitable arm system may be used such as, for example, a scara type arm coupled to frame 156 as shown in FIG. 17 and as will be described in greater detail below. Substrate 148 is supported on end effector 158.

Figure 12B:
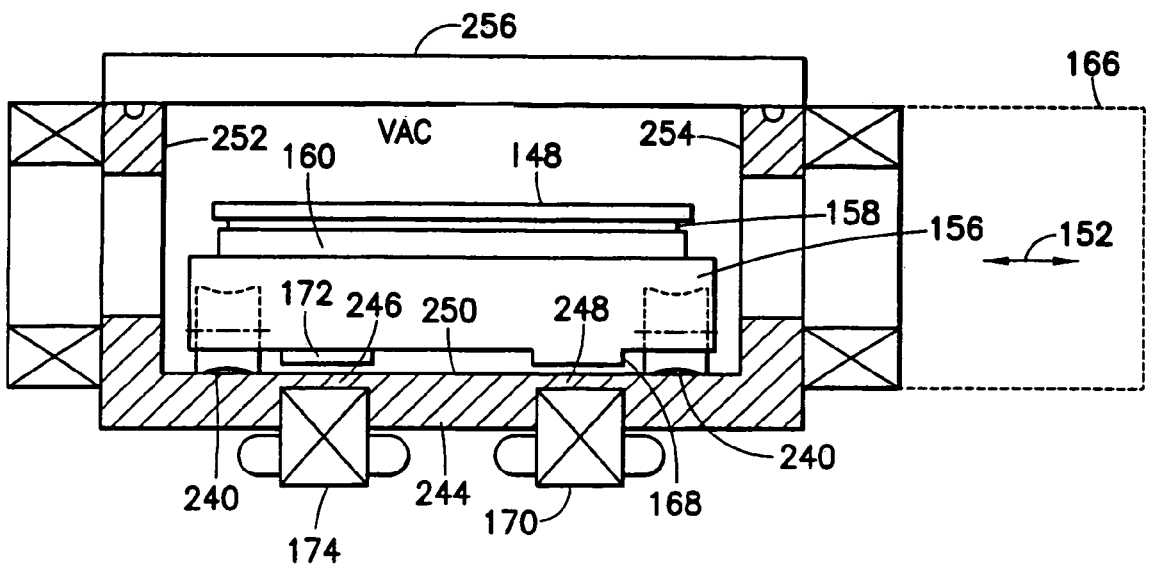
FIG. 12B is an end view of the exemplary cart in FIG. 12 in a portion of a chamber of the apparatus.
Figure 12A:
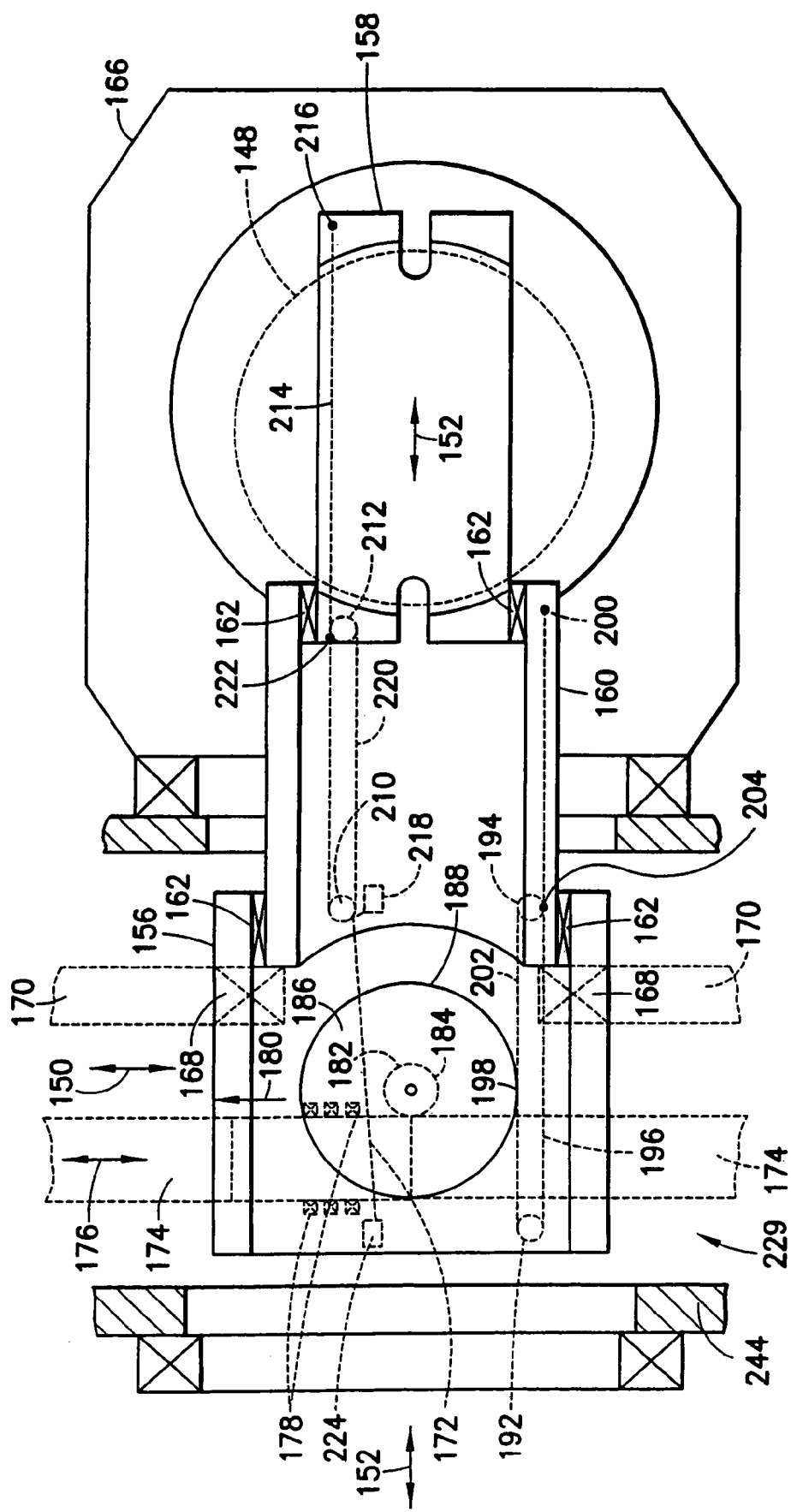
FIG. 12A is another top view of the exemplary cart in FIG. 12 with the cart shown in an extended position.

Referring now to FIG. 12A, there is shown a top view of exemplary cart 229, in a portion of chamber 229 (similar to chamber 18 and 602-626, see FIGS. 2-3, and 7-7A). The cart has the end effector 158 extended into exemplary module 166. Module 166 may be similar to any of the modules described before as being connected to the transport chamber. Cart 229 is shown as being capable of transporting substrate 148 along an axial path 150 and/or a radial path 152. Cart 229 has frame 156, end effector 158 and secondary frame 160. Slides 162 constrain frame 156, end effector 158 and secondary frame 160 to be slideable relative to each other along linear path 152 either to the left or right of frame 156 as shown. Frame 156 has magnetic platens 168 on its underside which interface with synchronous motor 170. Drive platen 172 interfaces with synchronous motor 174. Drive platen 172 is mounted on the underside of and slideable relative to frame 156 along direction 176 which is substantially parallel to direction 150 by using bearings 178. Movement of platens 168 and 172 simultaneously along direction 150 allows cart to move in direction 150 without motion in direction 152. Holding platens 168 stationary while simultaneously moving platen 172 along direction 176 relative to frame 156 causes a radial motion along direction 152 of substrate and end effector 148, 158.

Linear motion of platen 172 in direction 176 is translated into linear motion of secondary frame 160 along direction 152. Pulley 186 is rotatably coupled to frame 156 and has secondary pulleys 188 and 182. Pulley 182 is coupled to platen 172 with bands 184 such that movement of platen 172 along direction 180 causes pulley 182 to rotate in direction 190 with the opposite applying in opposing directions. Pulleys 192 and 194 are rotatably coupled to frame 156. Cable 196 is coupled to pulley 188 at point 198, wraps around pulley 192 as shown, and terminates at 200 on secondary frame 160. Cable 202 is coupled to pulley 188 at point 198, wraps around pulley 188 counterclockwise, wraps around pulley 194 as shown and terminates at 204 on secondary frame 160. In this manner, linear motion of platen 172 in direction 176 is translated into linear motion of secondary frame 160 along direction 152.

Linear motion of platen 172 in direction 176 and the translated linear motion of secondary frame 160 along direction 152 also further extends end effector 158 in direction 152 as shown. Pulleys 210 and 212 are rotatably coupled to secondary frame 160. Cable 214 is coupled to end effector 158 at point 216, wraps around pulley 210 as shown, and terminates at 218 on frame 156. Cable 220 is coupled to end effector 158 at point 222, wraps around pulley 212 and terminates at 224 on frame 156. In this manner, linear motion of platen 172 in direction 176 is translated into linear motion of secondary frame 160 along direction 152 which is further translated to further extension of end effector 158 in direction 152 as shown. In lieu of cable pulleys, the transmissions between platens and end effectors may use belts, bands or any other suitable transmission means made of any suitable materials. In alternate embodiments, a suitable linkage system may be used in place of cable pulleys to transmit motion from the platens to the end effectors. Retraction of the end effector 158, to the position shown substantially in FIG. 12, is accomplished in a similar but reverse manner. Further, extension of the end effector 158 to a position similar to but opposite from that shown in FIG. 12B is effected by moving platens 168, 172 in an opposite manner to that described above.

Referring now to FIG. 12B, there is shown an end view of cart 229 before being extended into exemplary process module 166. Slides 240 constrain frame 156 to be slideable along linear path 150 as shown. Frame 156 has magnetic platens 168 on its underside which interface with synchronous motor 170. Drive platen 172 interfaces with synchronous motor 174. Drive platen 172 is mounted on the underside of and slideable relative to frame 156 along a direction which is substantially parallel to direction indicated by arrow 150 (see FIG. 12). Movement of platens 168 and 172 simultaneously along direction 150 allows the cart to move in direction indicated by arrow 150 without motion in direction 152. Holding platens 168 stationary while simultaneously moving platen 172 along direction 176 relative to frame 156 causes a radial motion along direction 152 of substrate and end effector 148, 158. Platens 172 and 168 may have magnets that interface with motors 170 and 174. Chamber 244 may be made from a nonmagnetic material, for example non-magnetic stainless steel and provide a barrier 246, 248 between the motor windings and their respective platens. In alternate embodiments, more or less linear drives or carts may be provided. For example, a single drive motor may be provided having additional drive zones where platens 168 and 172 would interface with the same drive motor but be independently driveable by the different zones. As a further example, additional carts could be driven by different drive systems in the floor 250, the walls 252, 254 above in line with or below the slot openings or in the cover 256 of the chamber.

Figure 13A:
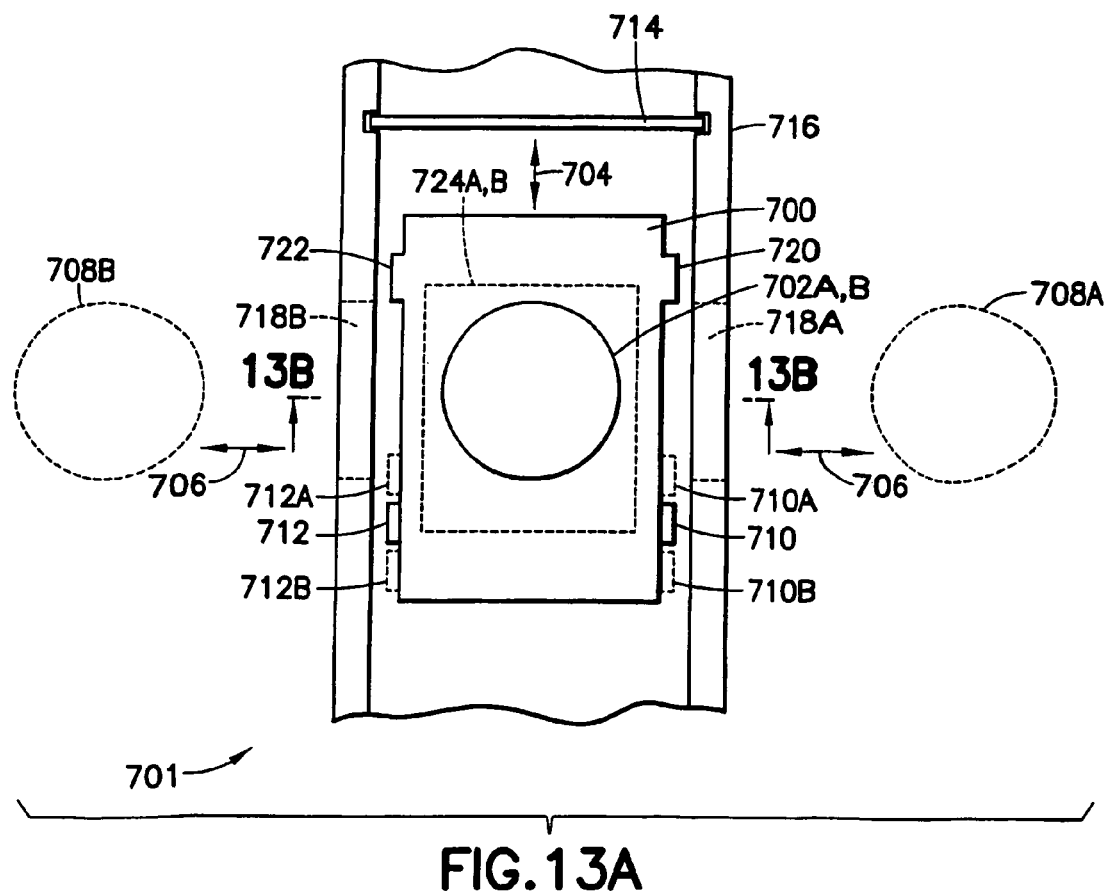
FIG. 13A is a top end view of a portion of a chamber of the apparatus with a drive system and transport cart in accordance with another embodiment of the apparatus.

Referring now to FIG. 13A, there is shown a portion of chamber 716 of the apparatus 10, and a top view of an exemplary drive system 701 with an exemplary cart 700 that may be used with the apparatus. Chamber 716 is another representative portion of chamber 18, or chambers 602-624 of the apparatus (see FIGS. 2-3, and 7-7A). Cart 700 is shown as being capable of transporting substrates 702A, 702B along an axial path 704 and/or a radial path 706 or in a Z motion (not shown—in and out of paper). In alternate embodiments, angular motion could be provided. In alternate embodiments, more or less substrate handling could be provided. Cart 700 has transport mechanisms 724A and 724B which can be a linear mechanism or any suitable arm system may be used such as, for example, a scara type arm. In alternate embodiments no arm may be provided. Transport mechanisms 724A and 724B may extended into process modules or other modules as desired in a manner similar to that shown in FIG. 12A. Cart 700 has platens 722, 720, 710 and 712 on its sides which interface with synchronous motors in the walls of transport chamber 716. Drive platen 712 is mounted on the side of cart 700 and is slideable relative to cart 700 along direction 704. Platen 712 drives mechanism 724A such that the movement of platen 712 along direction 704 (from location 712A to 712B, see FIG. 13A) relative to cart 700 allows mechanism 724A to transport wafer 702A between location 708A and 708B through slots 718A and 718B. Similarly, drive platen 710 is mounted on the side of cart 700 and is slideable relative to cart 700 along direction 704. Platen 710 drives mechanism 724B such that the movement of platen 710 along direction 704 (from location 710A to 710B, see FIG. 13A) relative to cart 700 allows mechanism 724B to transport wafer 702B between location 708A and 708B through slots 718A and 718B. Platens 710 and 712 are independently moveable relative to cart 700. Platens 722, 720 are fixed relative to cart 700. Holding platens 720, 722 stationary while simultaneously moving platen 712 along direction 704 causes a radial transfer motion along direction 706. Holding platens 720, 722 stationary while simultaneously moving platen 710 along direction 704 also causes a separate radial transfer motion along direction 706. Simultaneously moving platens 720, 722, 710 and 712 along direction 704 causes cart 700 to move along direction 704—enabling the cart 700 to move from process location to process location as through valve 714 for example.

Figure 13B:
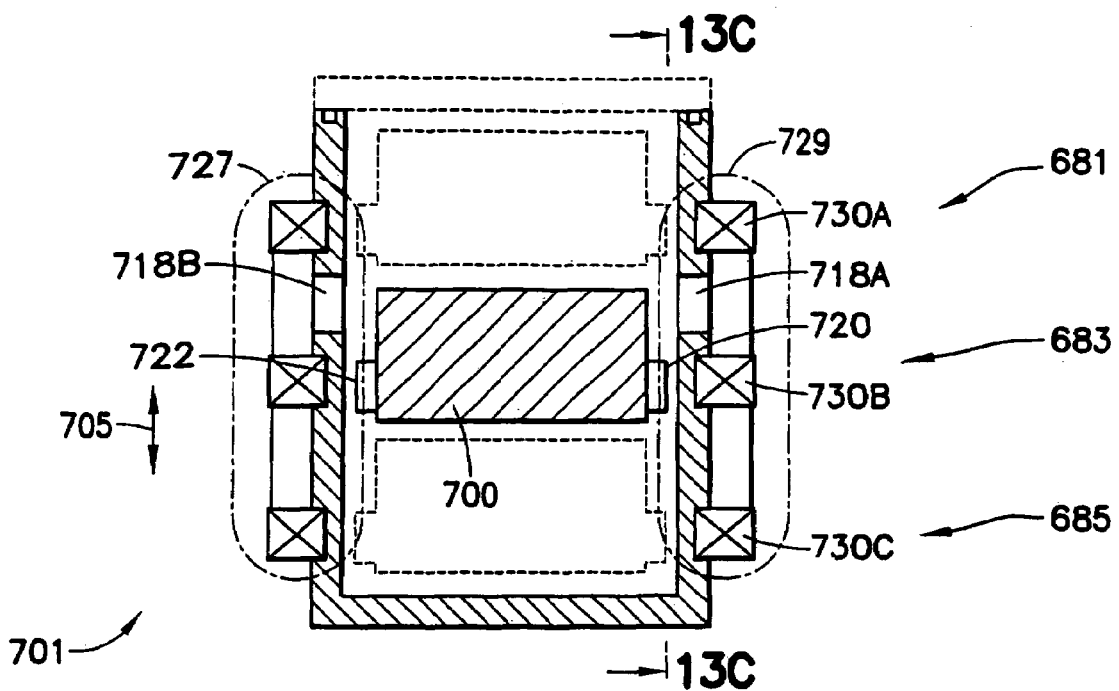
Figure 13D:
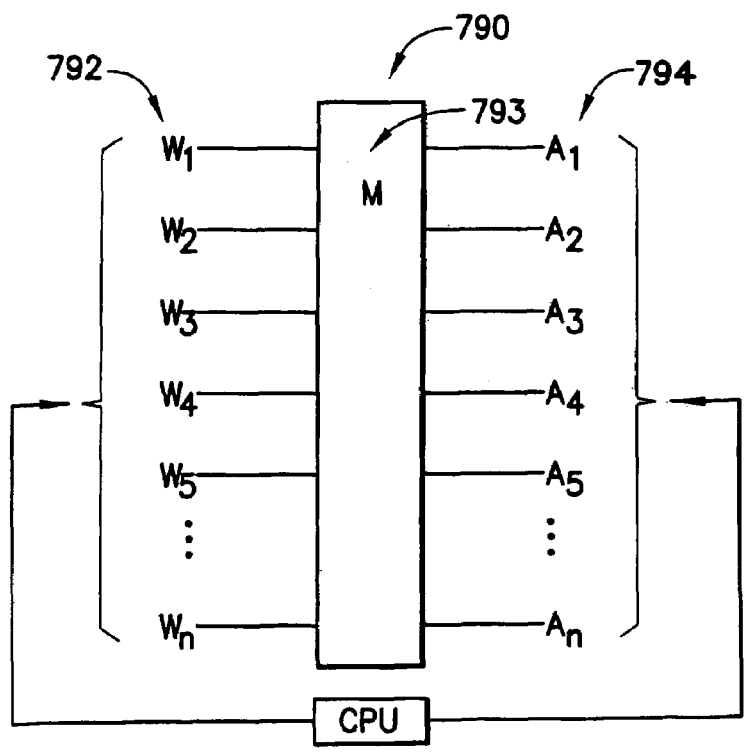
FIG. 13D is a schematic diagram of an exemplary drive system of the apparatus.

Referring now to FIG. 13B, there is shown a section view of the exemplary drive system 701 and cart 700 taken along line 13B-13B in FIG. 13A. Referring also to FIG. 13C, there is shown another side section view of the exemplary drive system 701 in FIG. 13B. System 701 has opposing stationary winding sets 727, 729 that drive cart 700. Winding sets 727, 729 are wound in a combination of one and two dimensional driving arrays, for example, vertical 705 and lateral 704. The driving arrays may be linear motors or linear stepping type motors in one or two dimensional arrays. Examples of such driving arrays are described in U.S. Pat. Nos. 4,958,115, 5,126,648, 4,555,650, 3,376,578, 3,857,078, 4,823,062, which are incorporated by reference herein in their entirety. In alternate embodiments, integrated two dimensional winding sets could be employed with platens having two dimensional magnets or patterns. In other alternate embodiments, other types of one or two dimensional drive systems could be employed. In alternate embodiments, additional arrays could be provided to drive cart 700 in different directions, for example by coupling system 701 to another similar system oriented 90 degrees therefrom. The arrays are driven in multiple zones in order to allow multiple carts to be driven independently. As an example, zone 685 could be a supply zone, zone 683 could be a transfer zone, and zone 681 could be a return zone. Within each zone may be sub-zones which allow driving multiple carts within each zone. In alternate embodiments, more or less zones or sub-zones may be provided in any of a number of combinations. Cart 700 is supported by the fields produced by winding sets 727, 729 and is positionable in a levitated and non-contact manner by biasing the fields between winding sets 727 and 729. FIG. 13C shows one possible winding combination that could be driven by the system shown in FIG. 13D and employed to levitate cart 700 (as for example as discussed further below with reference to FIG. 14A, or through multiple axis active levitation). One dimensional winding sets are provided in winding zones 732A-C and 730A-C and 734A-C and 742A-B and 740A-B. Two dimensional winding sets are provided in winding zones 736A-E and 738A-C. In alternate embodiments, any suitable combination of winding sets could be provided or a full 2-D array or otherwise could be provided. Cart 700 has platens 720 and 710 which may be used in combination with arrays 738B for platen 720 and arrays 736B,C and D for platen 710. By moving platen 710 in direction 704 (see FIG. 13A) and holding platen 720 stationary, a wafer may be radially moved through slot 718A. By simultaneously moving 710 and 720 in direction 705 (see FIG. 13B), a wafer may be picked or placed. By coordinating winding commutation and winding switching between zones, cart 700 may selectively be moved vertically and/or laterally through the different winding and drive zones. Chamber 716 may be provided as a barrier between winding sets 727, 729 and cart 700. In alternate embodiments, no barrier need exist, such as in the event that winding sets 727, 729 are inside the enclosure 716 where there is for example a clean air or nitrogen environment. In alternate embodiments, more or less platens or windings may be provided. Arrays of sensors 746, 747, 748 may be provided for sensing the presence of the magnets in the platens or the platens or the cart(s) for determining proper commutation and location and for fine position determination of the platens and the cart or for determining positions, such as the gap between platens and windings. A cart identification tag, as noted before, may be provided with a reader provided at appropriate stations to determine the cart id by station.

Figure 14A:
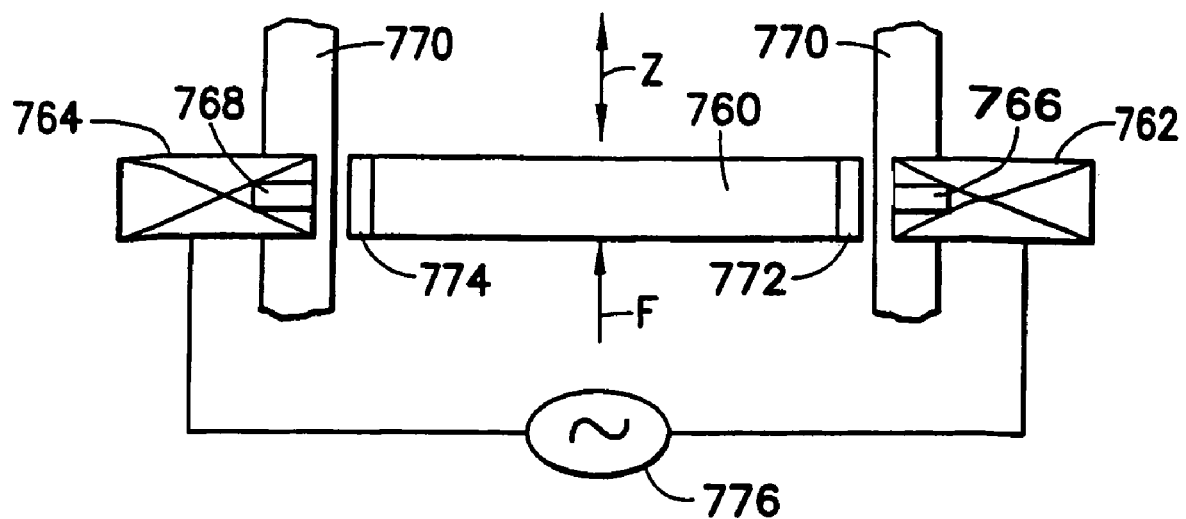
FIG. 14A is an end view of another embodiment of a cart used with the apparatus in FIG. 2.
Figure 14B:
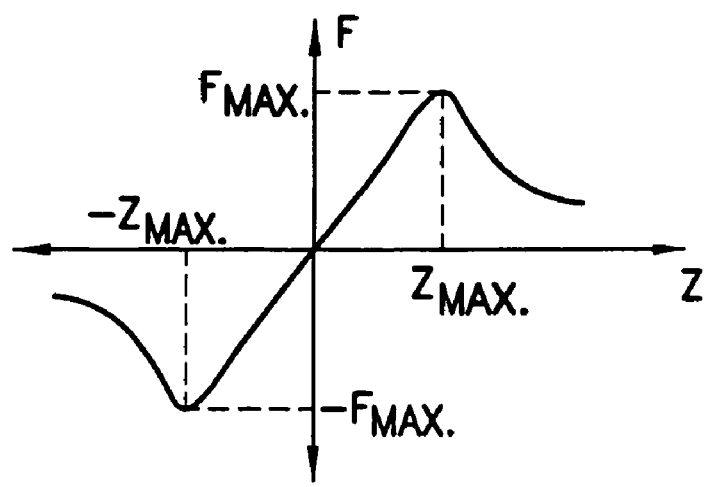
FIG. 14B is a graph illustrating the relationship between axial deflection Z and a restoring force F of the drive system.

Referring now to FIG. 14A there is shown an end view of another exemplary cart 760, in accordance with yet another embodiment, supported by the fields produced by single axis linear motor winding sets 762, 764. Exemplary cart 760 is positionable in a non-contact manner by biasing 776 the fields between winding sets 762 and 764. Position sensing 766, 768 is provided, in a close loop fashion with biasing 776, to levitate cart 760. Levitation may be accomplished in this simple manner as the cart is passively stabilized in the Z direction as shown in FIG. 14B. Cart 760 has magnetic platens 772 and 774 on its sides which may have magnets or be made from magnetic or conductive materials which interface with winding sets 762, 764. In alternate embodiments, more or less platens could be provided, driving arms for example. Chamber 770 (similar to any representative portion of the chambers 18, 602-624 of the apparatus, see FIGS. 2-3, and 7-7A) may be made from a nonmagnetic material, for example non-magnetic stainless steel and provide a barrier between the motor windings and their respective platens as described before. In alternate embodiments, more or less linear drives or carts may be provided. For example, a single drive motor may be provided having additional drive zones where platens would interface with the same drive motor but be independently driveable by the different zones. As a further example, additional carts could be driven by different drive systems in the floor, the walls above in line with or below slot openings or in the covers of the chamber.

In FIG. 14B the relationship between the restoring force F and the axial deflection Z from the desired position of cart 760 is graphically illustrated. In the respective positive or negative axial direction (z direction) the restoring force first increases in magnitude to a value FMAX or −FMAX respectively up to a maximal deflection ZMAX or −ZMAX respectively, but decreases again however when this deflection is exceeded. Therefore, if a force is applied to cart 760 (such as cart weight or external forces, such as from other winding sets that drive the same or other platens or otherwise) that exceeds FMAX, then the cart escapes from the windings 762, 764. Otherwise, cart 760 will stay within the fields as long as they are applied. This principle, described in US patent references (which are hereby incorporated by reference in their entirety) U.S. Pat. Nos. 6,485,531, 6,559,567, 6,386,505, 6,351,048, 6,355,998 for a rotary devices is applied in the drive system 701, of the apparatus described herein, in a linear fashion to levitate exemplary cart 760. In alternate embodiments, other drive systems or levitation systems may be used.

Referring again to FIG. 13D, there is shown a diagram of an exemplary winding drive system 790 suitable for use with cart/platen drive system 701 in FIG. 13A. Winding drive system 790 has windings 792, multiplexer 793 and amplifier modules 794. Windings 792 may have windings and/or sensors such as hall sensors, positions sensors, inductive sensors, carrier identification sensors, status and fault detection logic and circuitry or otherwise. Amplifier modules 794 may have single or multiple phase amplifiers, position and/or presence sensor inputs or outputs, CPUs and/or memory, identification reader inputs or outputs, status and fault detection logic and circuitry or otherwise. Amplifier modules 794 may connect directly to windings 792 or through multiplexer unit 793. When using multiplexer unit 793, amplifiers A1-Am may be selectively connected to any of windings W1-Wn. A CPU coordinates this selective connection and monitors the status of the devices. In this manner, the CPU may selectively take amplifier modules or windings off line for service without shutting down the tool.

Figure 22:
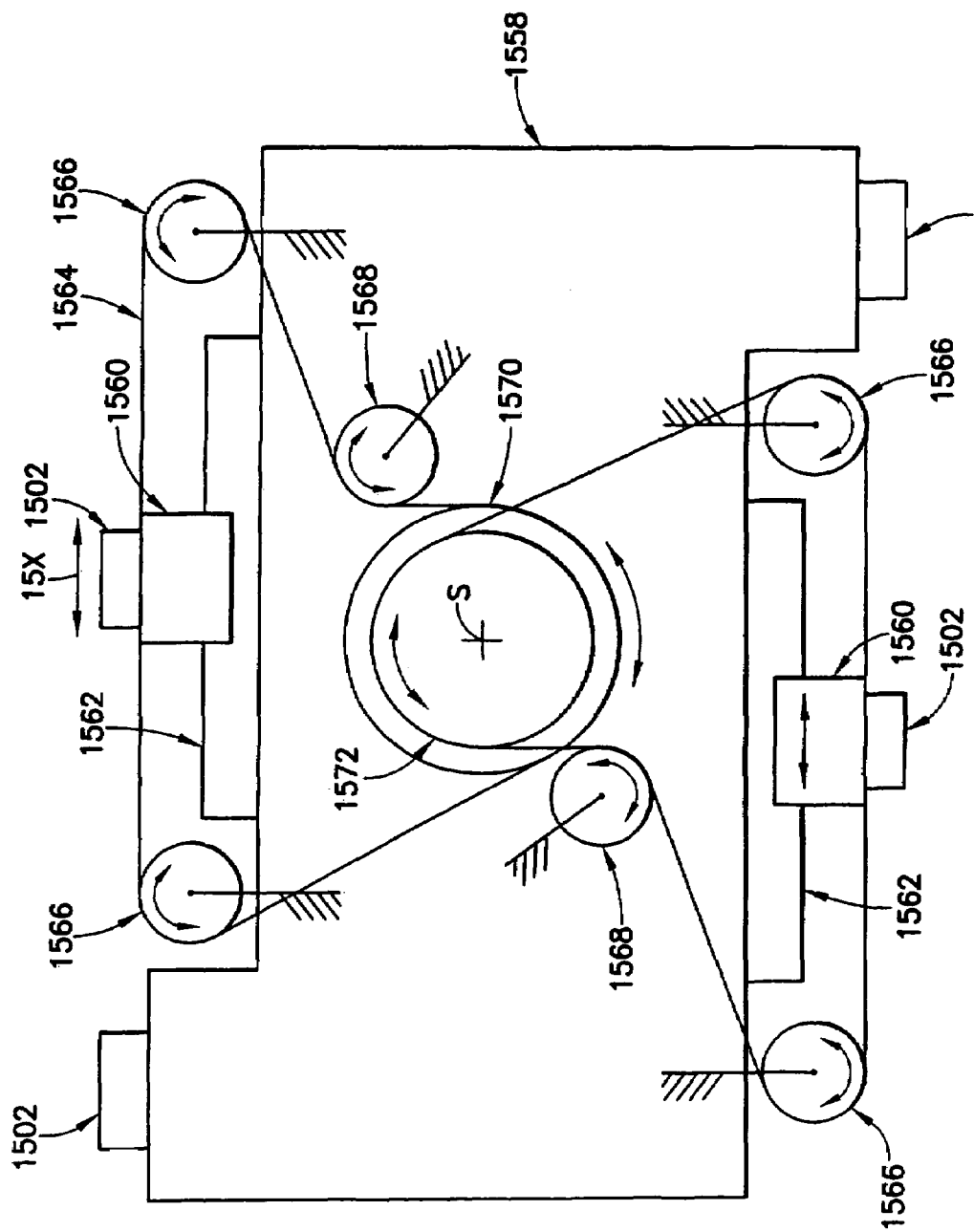
FIGS. 22-23 respectively are a schematic top plan view and schematic elevation view of yet another embodiment of the transport cart for the apparatus.
Figure 23:
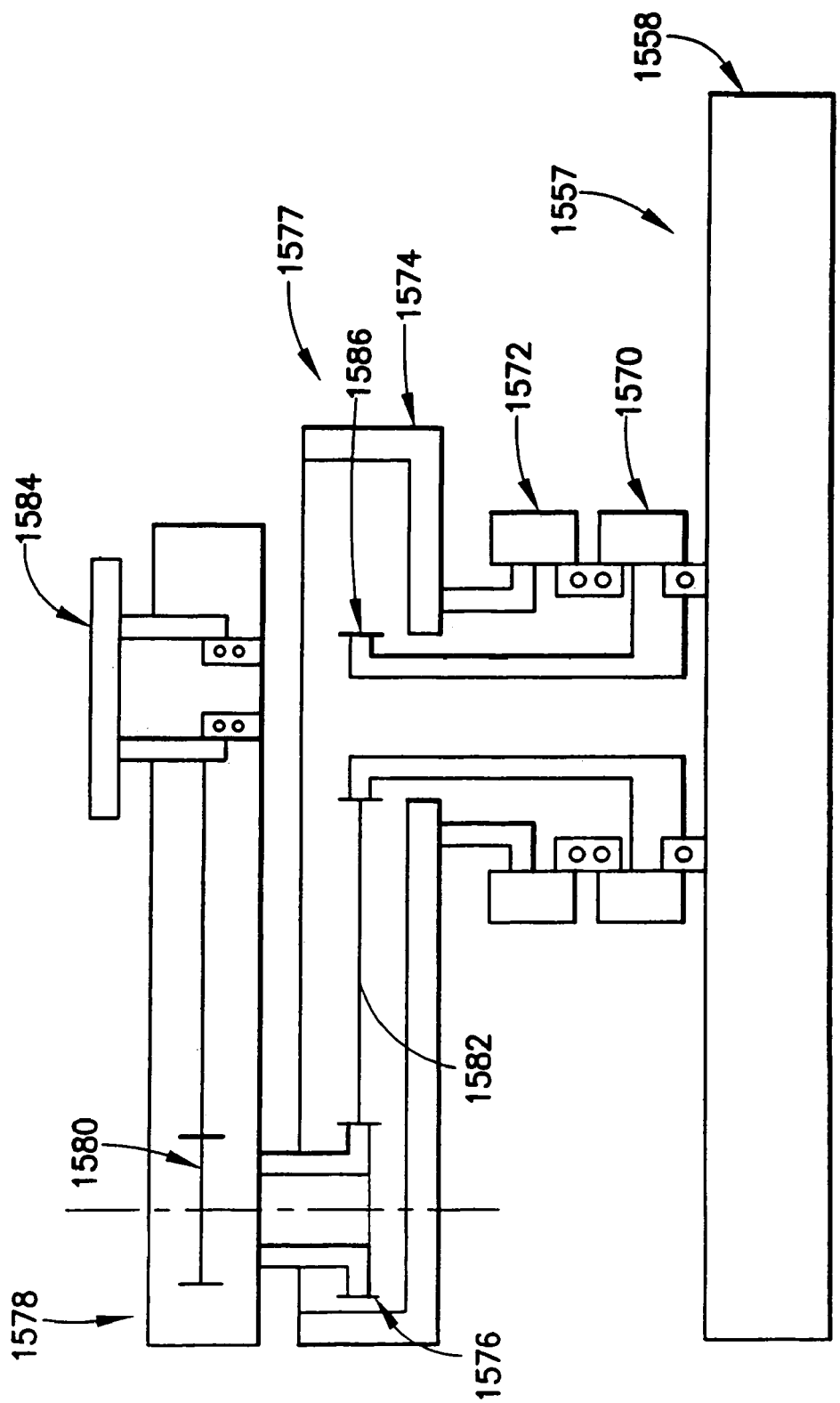
Figure 23A:
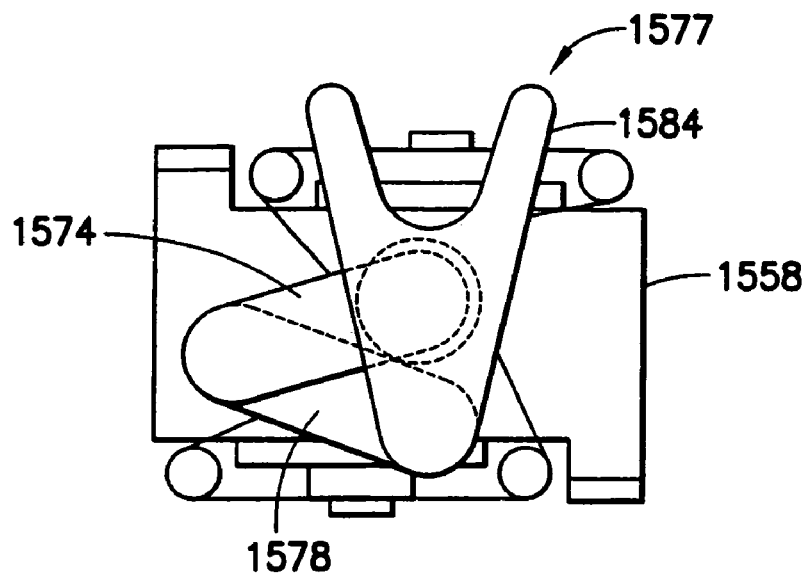
FIGS. 23A-23B respectively are other top plan views of the transport cart in FIG. 22 with a transfer arm of the cart in two different positions.
Figure 23B:
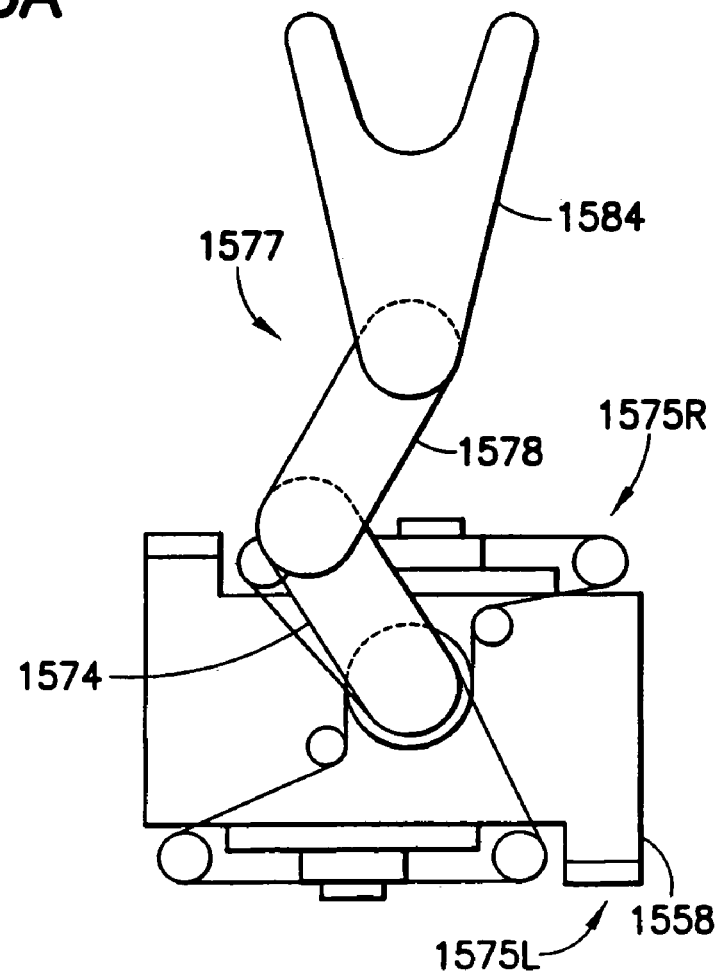

As noted before; the transport apparatus or carts suitable for use in the transport chambers 18, 602-624 (see for example FIGS. 2-3, and 7-7A) may comprise carts with or without a transfer arm for transferring semiconductor workpieces between the cart and a desired location in the apparatus. FIGS. 12 and 13A respectively show, as described before, two exemplary embodiments of transport carts 229, 700 with transfer arms for handling semiconductor workpieces in the apparatus. Referring now ahead to FIGS. 22 and 23, there is shown another embodiment of a transport cart mechanism 1557 suitable for use in the chambers of apparatus 10. Cart 1557 may include base section or base plate 1558 and transfer arm 1577 mounted to the base plate. As shown in FIG. 22, the cart mechanism base plate 1558 with two coupled magnet arrays 1502 on opposite sides of the plate, but not limited to opposite corners of the plate. On the opposing corners of the robot base plate 1558, two addition magnet arrays 1502 are coupled to linear bearing carriages 1560 and are made to slide on linear bearing rails 1562. These linear bearing rails 1562 are coupled to the base plate 1558. A drive belt 1564 or other means of converting linear motion to rotary motion is attached to the linear bearing carriage 1560. In the case shown, the drive belt 1564 is wrapped around an idler pulley 1566 and then a pulley tensioner 1568 and attached to a drive pulley 1570. The linear motion applied to the bearing carriage 1560 through the magnet array 1502, will result in rotary motion of the driven pulley 1572. In the case of a two degree of freedom application, a redundant version of the mechanism described is applied to the opposite side of the robot cart mechanism and a duplicate circuit is attached to drive pulley 1572. This combination yields a concentric pulley assembly. The relative motion between the fixed magnet array 1502 and the combined magnet array 1502 and linear bearing carriage 1560 provides a means of driving the transfer arm linkage. In the case of linear transport of the robot carriage, the linear bearing/magnet array 1560/1502 and the coupled magnet array/cart base plate 1502/1558 are driven as a fixed set and no rotation of the driven pulleys 1570 & 1572 is seen. The drive mechanism of base plate 1558 may be used for operating other suitable transfer arm linkages, some examples are shown in FIGS. 24-24C, 25-25C). The transfer arm 1577 in the embodiment shown in FIG. 23, has a general single SCARA arm configuration. Drive pulley 1572 is coupled to the lower link arm 1574 and drive pulley 1570 is tied to forearm drive pulley 1586. The rotation motion of the forearm pulley 1586 is coupled to the forearm 1578 through the drive belt 1582 and the elbow pulley 1576. The wrist/end effector 1584 is driven by the resulting relative rotation motion of the forearm 1578 with respect to the wrist elbow pulley 1580 as it is grounded to the lower link arm 1574. Typically, this motion is achieved by the pulley ratio at each joint with respect to the input drive ratio of pulleys 1572 and 1570. Referring also to FIGS. 23A-23B, the transfer arm linkage 1577 is shown respectively in retracted and extended positions. The movement between retracted and extended positions is achieved (in a manner as described above) by moving the movable magnet arrays 1502 as desired relative to the base plate. The movement of the arm linkage may be performed with the cart stationary or moving relative to the transport chamber. FIGS. 23A-23B show the transfer arm 1577 positioned so that when extended the arm 1577 extends to the lateral side 1576R (i.e. the side of the cart facing a chamber wall) of the cart. This is similar to the extension/retraction movement of the transfer mechanism 724A,B of cart 700 in FIG. 13A. As can be realized, the transfer arm 1577 on cart 1557 may be rotated as a unit (using movable magnet arrays 1502) about axis of rotation S (see FIG. 22) to any desired orientation relative to the cart base plate. For example, if rotated about 180° from the orientation shown in FIGS. 23A-23B, the transfer arm 1577 may be extended to the opposite side 1575L from that shown in FIG. 23B. Further, the transfer arm may be rotated about 90° so that the arm extension is along the linear direction of the chamber (indicated by arrow 15X in FIG. 22). Any number of arm linkages may be employed with such a cart. Other examples of suitable arm linkages that may be used with the cart are described in U.S. Pat. Nos. 5,180,276; 5,647,724; 5,765,983; and 6,485,250 all incorporated by reference herein in their entirety.

Figure 24:
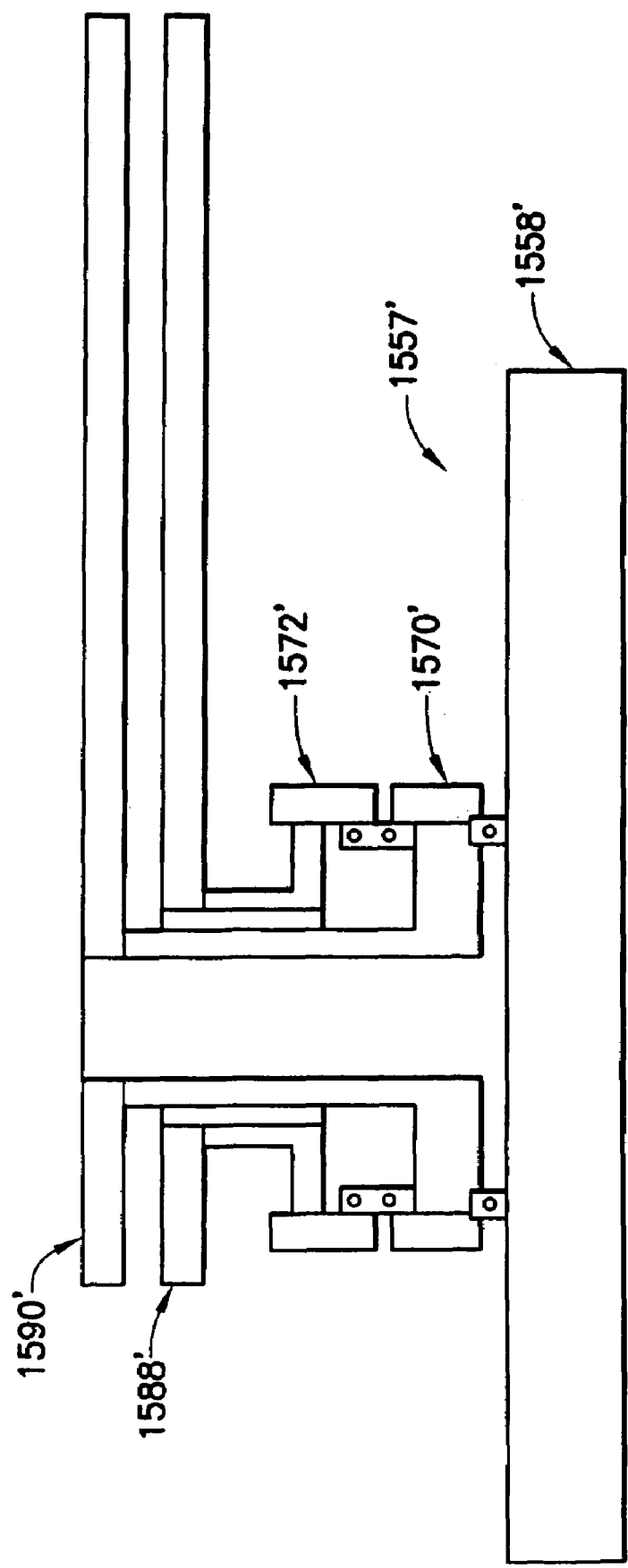
FIG. 24 is a schematic elevation view of another embodiment of the transport cart.
Figure 24A:
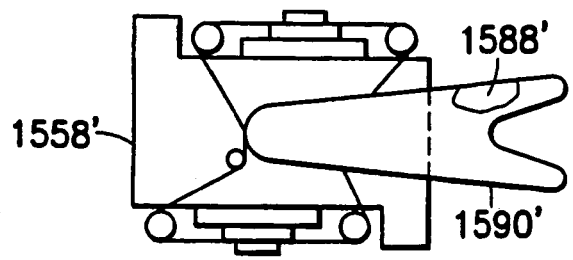
FIGS. 24A-24C respectively are plan views of the transport cart in FIG. 24 with the transport arm linkage of the cart in three different positions.
Figure 24B:
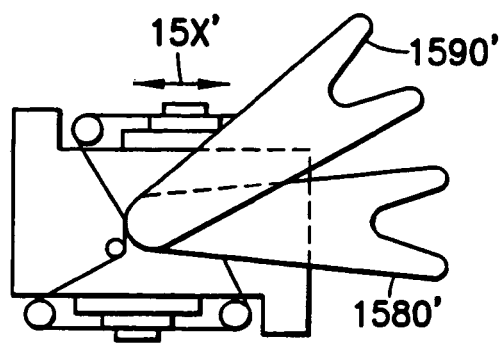
Figure 24C:
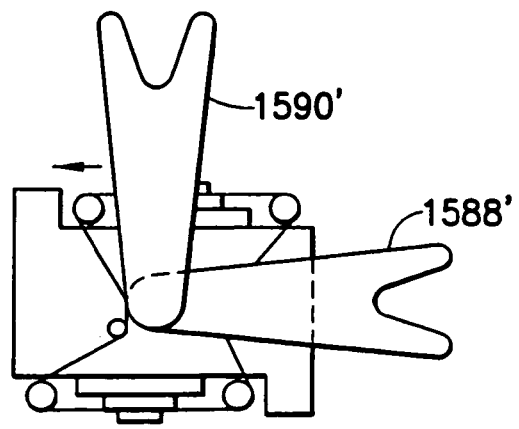

FIG. 24 is an elevation view of another embodiment of the cart mechanism 1557' with dual rotary end effectors mounted to the cart base plate 1558'. Cart 1557' is otherwise similar to cart 1557 described before and shown in FIGS. 22-23. Similar features are similarly numbered. FIGS. 24A-24C show the use of both linear transport and couple relative motion of the bearing carriage array as the cart is moving. As described before with reference to FIG. 22, the rotation of pulleys 1570' and 1572' results from the bearing carriage and magnet array moving with respect to the fixed magnet arrays which are coupled to the cart's base plate. In the combined case, the robot cart transport is moving along the linear chamber, in the direction indicated by arrows 15X', and the bearing carriage and magnet array move with respect to the grounded arrays. This motion enables the end effector(s) 1588' and 1590' to rotate thereby causing the robot end effector to extend substantially perpendicular to the linear direction of the cart similar to FIGS. 23A-23B, described before. FIGS. 24A-24C show the end effectors 1588' and 1590' extended to one side for example purposes. As can be realized however, the end effectors 1588', 1590' may be extended to any side of the base plate. Further, the end effectors 1588', 1590' may be extended to any side of the base plate. Further, the end effectors 1588', 1590' may be extended to a position where the end effector is oriented at an angle more or less than about 90° as shown in FIGS. 24A-24C.

Figure 25:
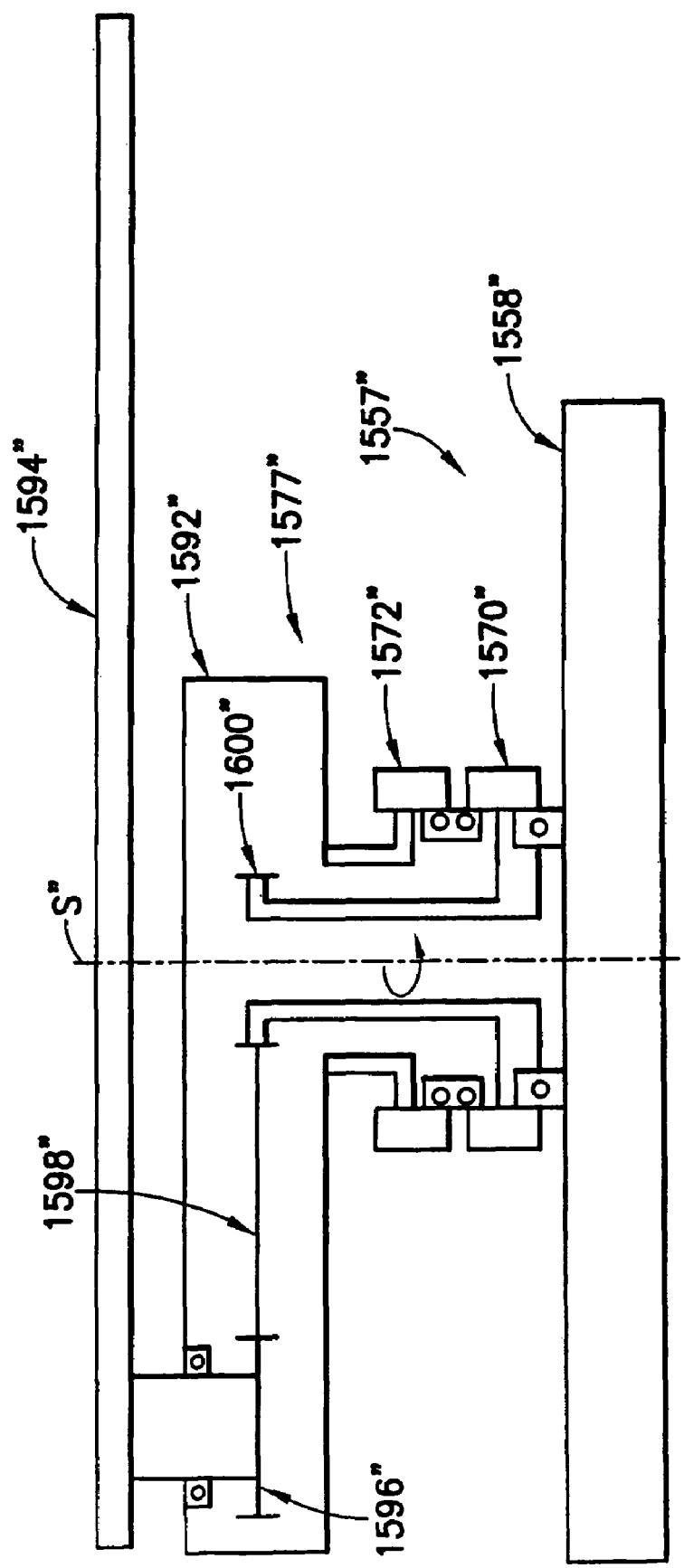
FIG. 25 is a schematic elevation view of still another embodiment of the transport cart.
Figure 25A:
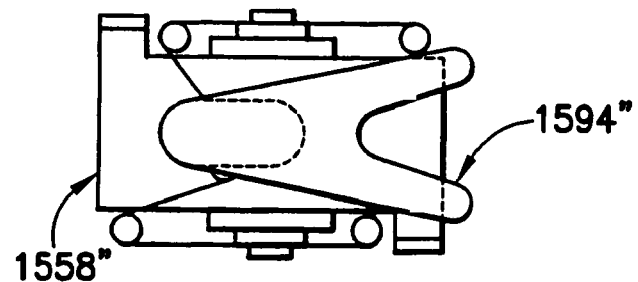
FIGS. 25A-25C respectively are plan views of the transport cart in FIG. 25 with the transport arm linkage of the cart in three different positions.
Figure 25B:
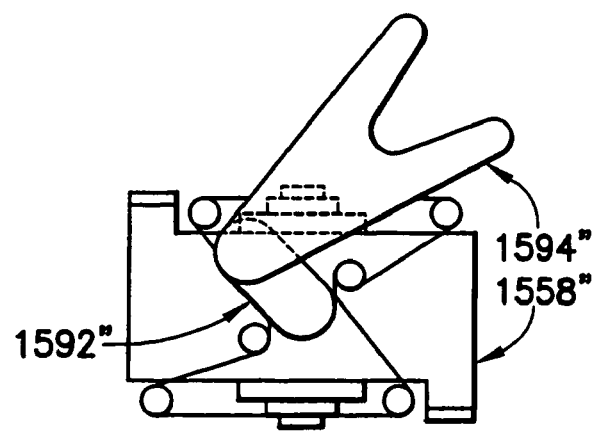
Figure 25C:
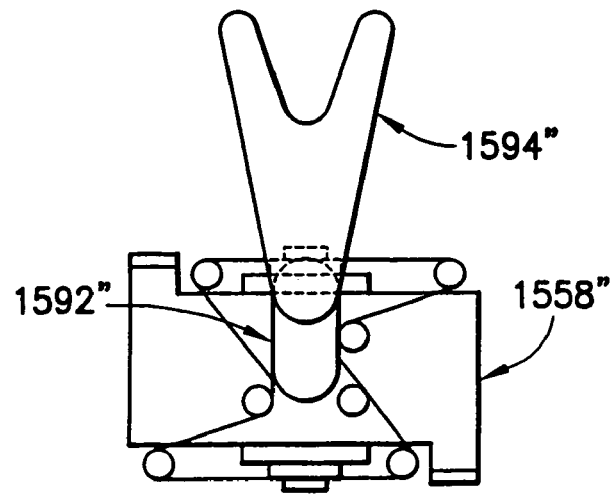

FIG. 25 is a schematic elevation view of still another embodiment of the cart 1557", having and arm linkage similar to that shown in FIG. 23. In this case, the drive pulley 1572" is attached to the lower link arm 1592". The driver pulley 1570" is coupled to the end effector driver pulley 1600" and coupled to the elbow pulley 1596" through a drive belt 1598". The elbow drive pulley is attached to the robot end effector 1594" and provides a means of transmitting the rotation of driver pulley 1570" to the driven end effector 1594". FIGS. 25A-25C show the cart with the arm linkage in three different positions. FIGS. 25A-25C show the end effector 1594" extended to one side of the base plate 1558" of the cart for example purposes only. Similar to the transfer arms shown in FIGS. 22-23 and 24, the transfer arm 1577" may be rotated about axis S" so that the end effector may be extended/retracted in any direction relative to the base plate 1558" of the cart 1557". With reference now also to FIGS. 2-7A, a significant advantage of using carts (such as carts 22, 122A, 406, 229, 700, 1557, 1557', 1557" shown in FIGS. 12, 13A, 22, 23, 24, and 25) with articulate transfer arms is that for a given reach of the transfer arm, the transfer chamber may be provided with the minimum width. The multi-axis articulation of the transfer arms on the different cart embodiments, allows substantially independent placement of the cart relative to the path of the articulating arm, which in turn allows the width of the transport chamber 18 to be reduced to a minimum. Similarly, the width of slot valves and passages connecting storage processing modules to the transport chamber may be reduced to minimum size.

Figure 15:
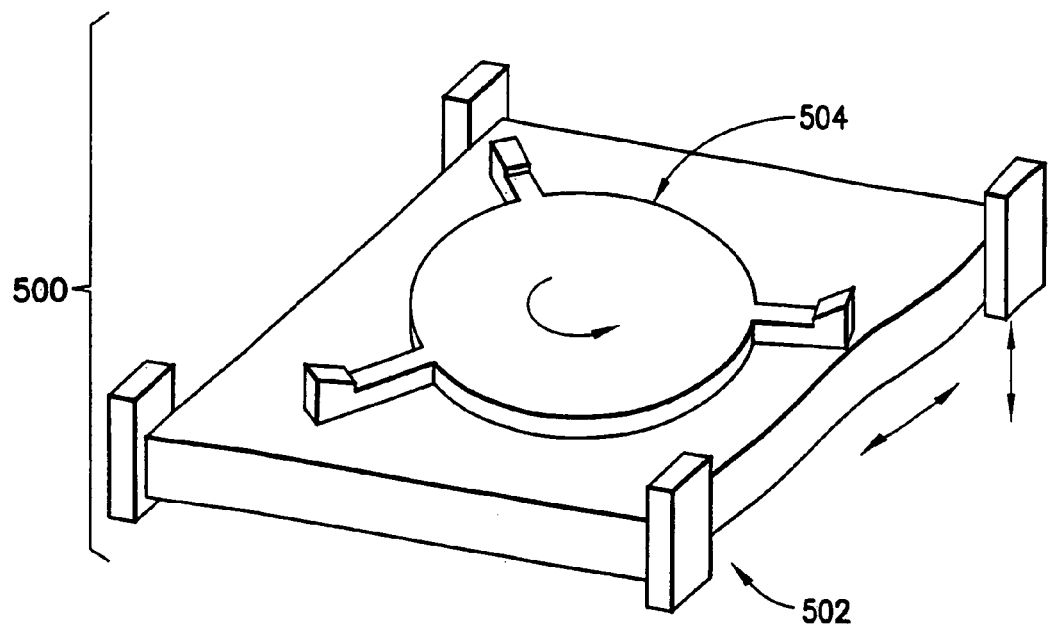
FIGS. 15-16 are respectively a schematic perspective view and an exploded elevation view of semiconductor workpiece transport cart of the apparatus in accordance with another embodiment.

Referring now to FIG. 15, an exemplary wafer aligner 500 for use with apparatus 10 is shown. The wafer aligner carrier 500 may generally include two parts, wafer chuck 504 and the wafer transport carrier 502. The aligner provides wafer alignment and movement within the linear Cartesian transport tool. The aligner is made to interface with the transport cart(s) in the apparatus (such as for example carts 22, 122A, 406, 700, 1557) or in some cases may be included in the robot cart of the linear process tool architecture.

Figure 16:
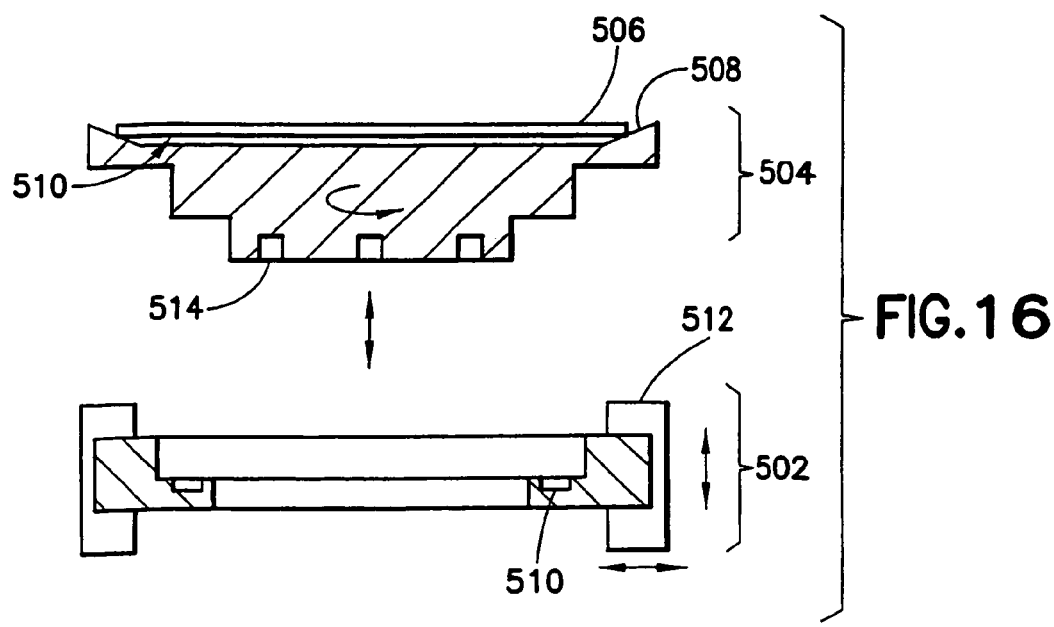

Referring also to FIG. 16, the wafer chuck 504 is shown to be able to separate from the wafer transport carrier 502. Friction pads may couple the two devices during transport throughout the linear Cartesian apparatus. When disassembled, the wafer chuck 504 is free to rotate with respect to the wafer transport carrier 502. The wafer chuck 504 provides a means of passive wafer edge support by using angle ramped wafer edge pads 508 with respect to the substrate (wafer) 506. An additional feature as part of the wafer chuck 504 is the relief beneath the wafer 506 for the ability of the robot arm cart to remove and place the wafer onto the wafer carrier 500. This is identified as wafer removal clearance zone 510.

This method of wafer rotation with respect to the linear transport cart can be applied directly to the robot's end effector. This method is shown in FIG. 17. The robot arm cart 534 is configured so that the wafer chuck 504 is removable from the robot's end effector 536. In this case, the chuck is free to be rotated to correct for any slight wafer notch orientation requirements based on drop off point changes found in the process modules or load locks.

Figure 18:
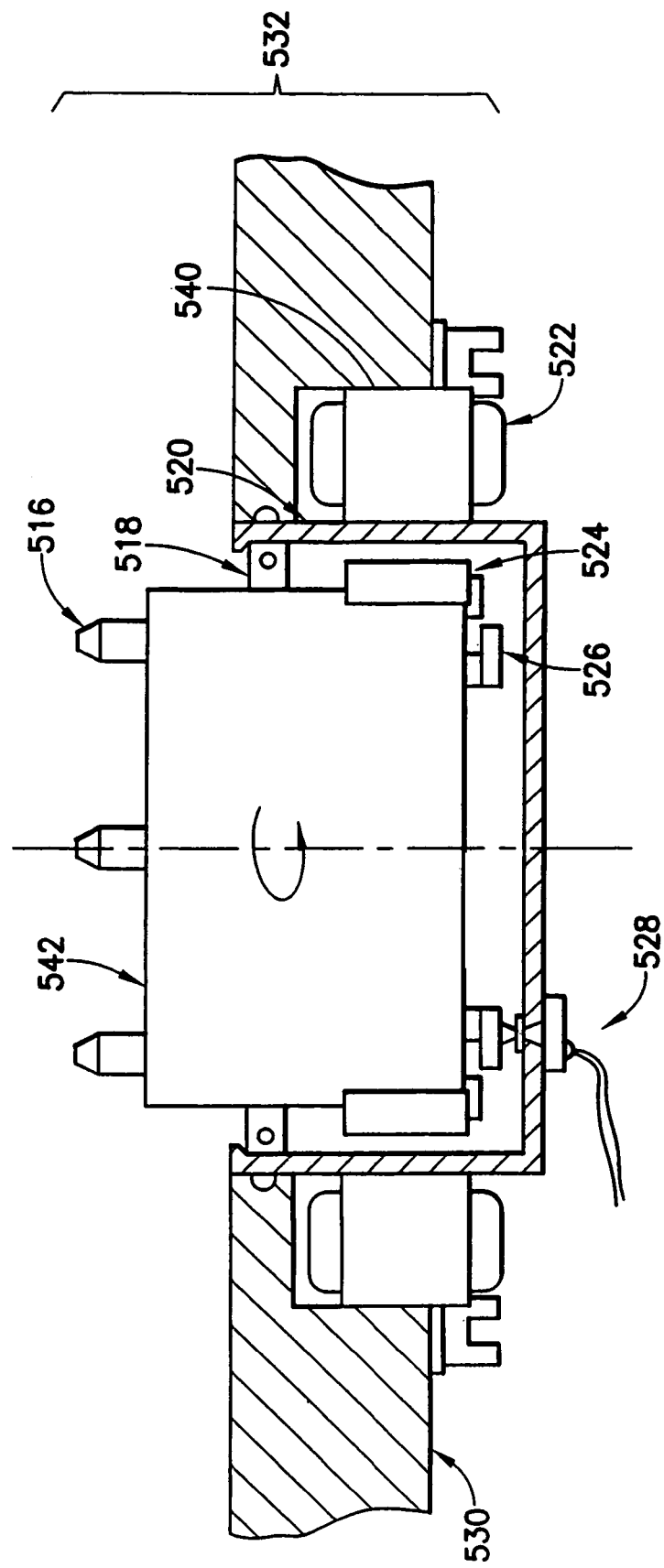
FIG. 18 is a cross-section of a portion of the transport apparatus in FIG. 2 and a workpiece chuck rotation device of the apparatus.

Referring also to FIG. 18, the wafer chuck rotation device 532 is shown. At multiple points within the linear transport tool, these rotational wells can be deployed. This device is based on motor isolation techniques found in U.S. Pat. No. 5,720,590 which is hereby incorporated by reference in its entirety. In alternate embodiments, a conventional motor and seal combination may be used. A stationary motor 522 is mounted to the linear transport chamber's base 530. A vacuum isolation barrier 520 is placed between the motor armature 540 and the magnet array 524. The magnet array is mounted directly to the rotation shaft 542. This allows for direct drive coupling into the vacuum system. A possible support bearing 518 may be required but ideally, magnetic suspension is used. An optical encoder disc 526 is attached to the rotation shaft 542 with the read head 528 placed in a location to provide position feedback to the controller for the rotation shaft's 542 angle. The aligner chuck 504 is lowered onto the friction pads or kinematics pin(s) 516. These pads/pins provide a means of wafer chuck 504 rotation once the wafer chuck 504 is disconnected from the wafer carrier 502 or the robot's end effector 536. This same means of providing rotation can be applied to control the rotational position of a robotic arm link 538 applied as part of the robot arm carrier shown in FIG. 17.

Figure 19:
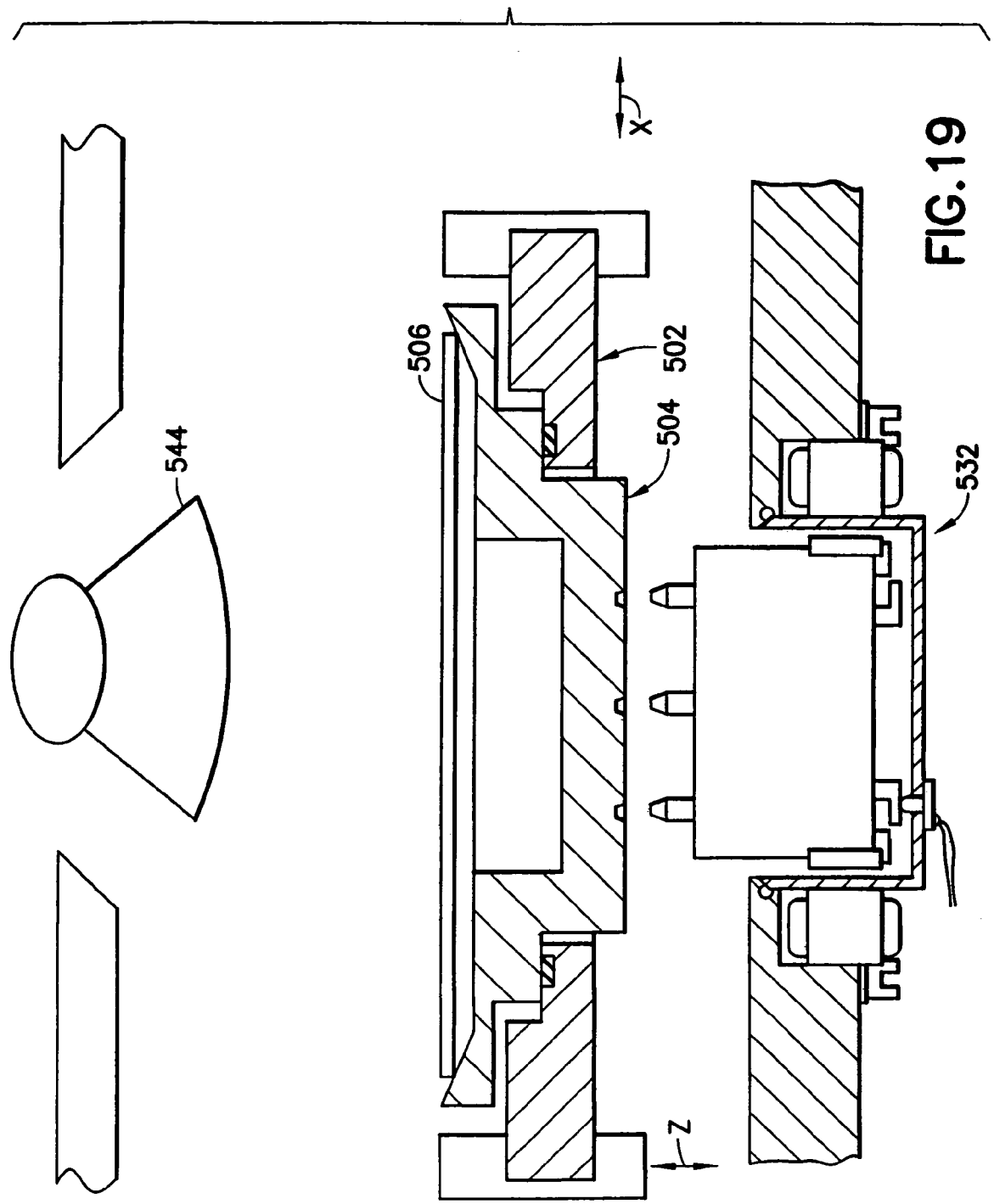
FIGS. 19-20 respectively are elevation views of the workpiece chuck rotation device and a transport cart of the apparatus with the transport cart in different positions.
Figure 20:
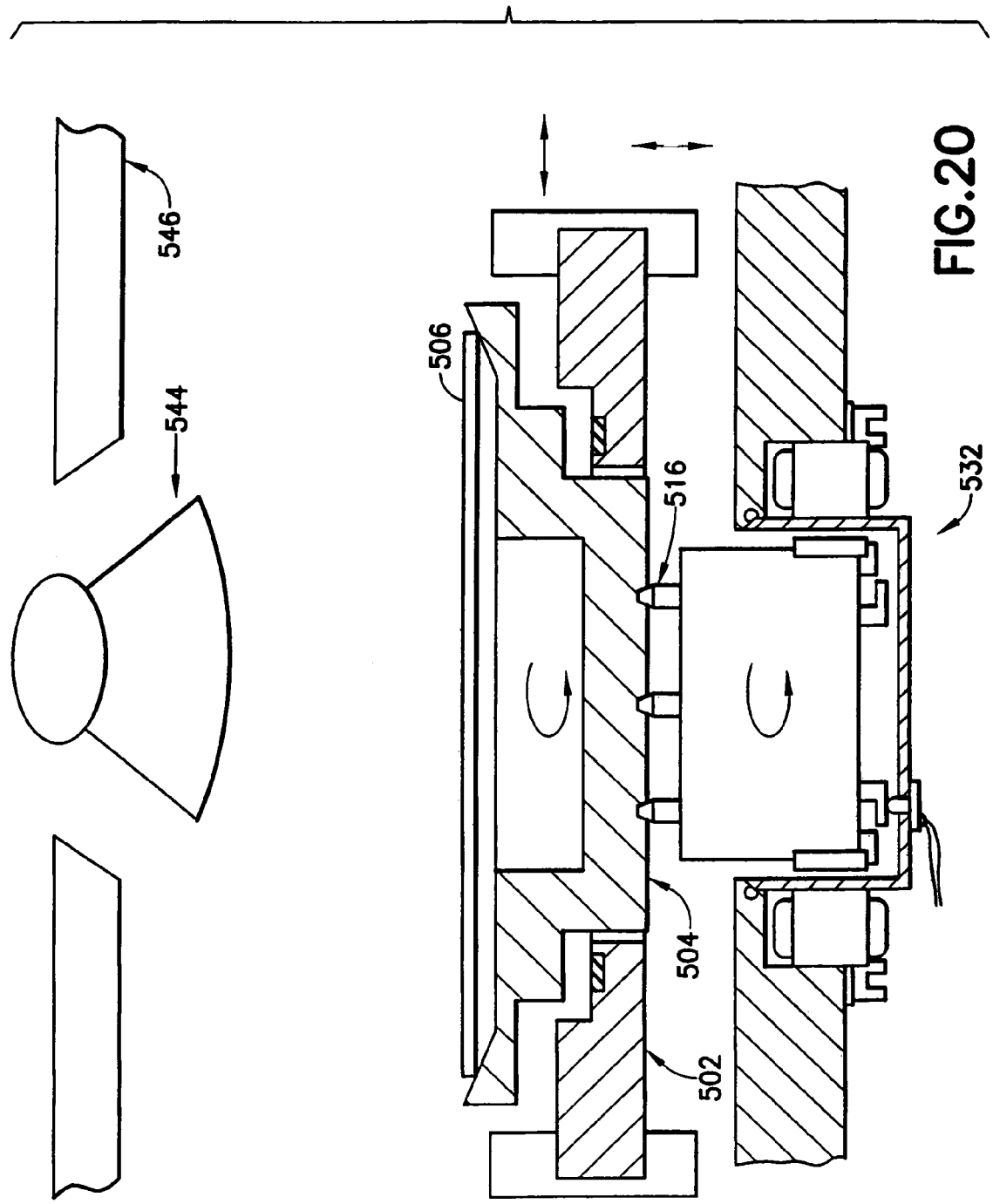
Figure 21:
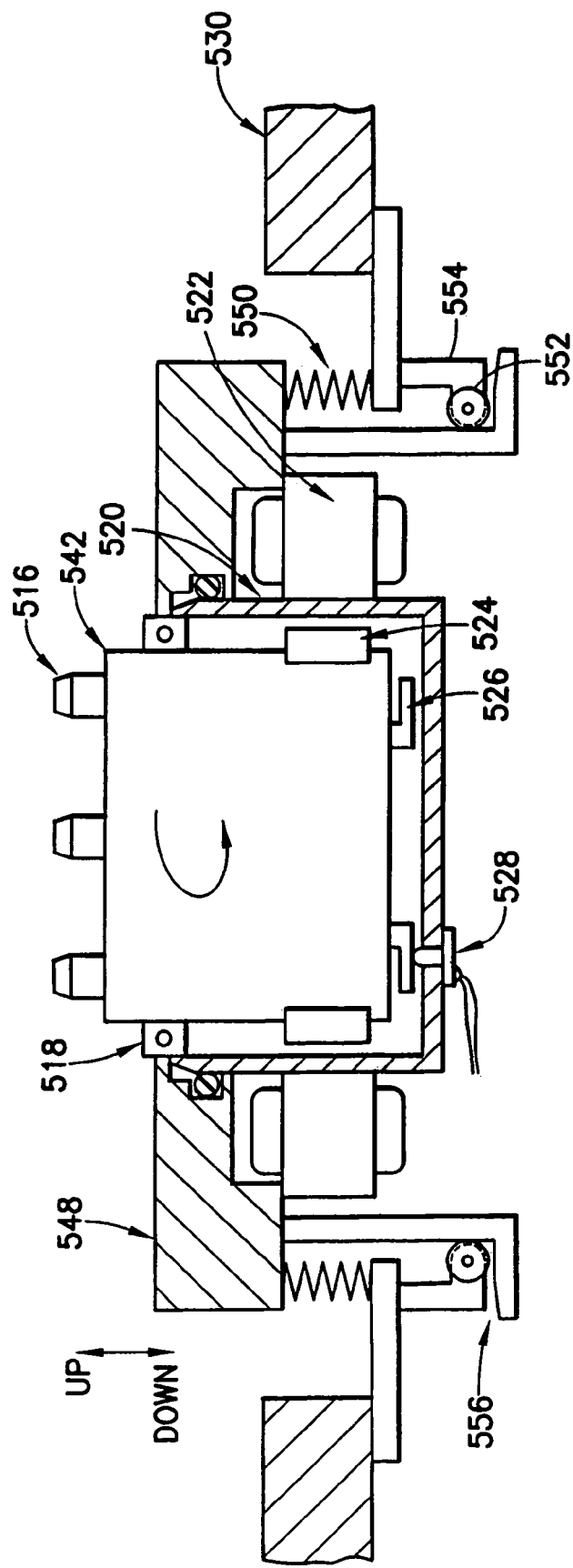
FIG. 21 is another schematic elevation of the chuck rotation device in accordance with yet another embodiment.

Referring also to FIG. 19, the wafer transport carrier 500 consisting of the wafer chuck 504 and the wafer transport carrier is moved to a position above the wafer chuck rotation device 532. In FIG. 20, the wafer transport carrier is lowered such that the wafer chuck 504 is lifted off on the transport carrier 502. A camera 544 located in the transport's chamber lid 546 is able to look at the image of the wafer and identify the wafer's x-y position and the location angle of the wafer's notch. The wafer carrier can then be moved to provide x-y location change of the wafer chuck 504 with respect to the wafer transport carrier 502 and rotation, can be provided to correct for notch alignment. Another option for the wafer chuck rotational drive when used as a method of robot arm carrier device is to allow rotational engagement while extending the robot link arm and requiring vertical axis of motion to allow for the substrate or wafer to be lowered/raised from the process module or load lock. A method of this approach is schematically shown in FIG. 21. A stationary motor 522 is mounted to a guided plate 548. The guided plate is attached to the linear transport chamber's base 530 via a metal bellows 550 or other linear isolation seal (lip seal, o-ring, etc.). A vacuum isolation barrier 520 is placed between the motor armature 540 and the magnet array 524. The magnet array is mounted directly to the rotation shaft 542. This allows for direct drive coupling into the vacuum system. A possible support bearing 518 may be required but ideally, magnetic suspension is used. An optical encoder disc 526 is attached to the rotation shaft 542 with the read head 528 placed in a location to provide position feedback to the controller for the rotation shaft's 542 angle. An additional guide roller 552 and the supporting structure 554 with end of travel stop 556 allow the rotation drive to be held positioned as required to engage the wafer chuck or robot arm rather than using the linear wafer transport carrier 500 as the actuation device. In the case where the transport chamber is pressurized resulting in a state where the robot drive is positioned up, the force of the bellows will act as a spring and allows the rotational device to be engaged with various linear robot arm cart vertical elevations (such as during a pick or place) but over a practical limited vertical travel range. Once the device is engaged the friction pads or kinematics pin(s) 516. These pads/pins provide a means of wafer chuck 504 rotation once the wafer chuck 504 is disconnected from the wafer carrier 502 or the robot's end effector 536 as shown in FIG. 20. This same means of providing rotation can be applied to control the rotational position of a robotic arm link 538 applied as part of the robot arm carrier shown in FIG. 17.

Figure 26:
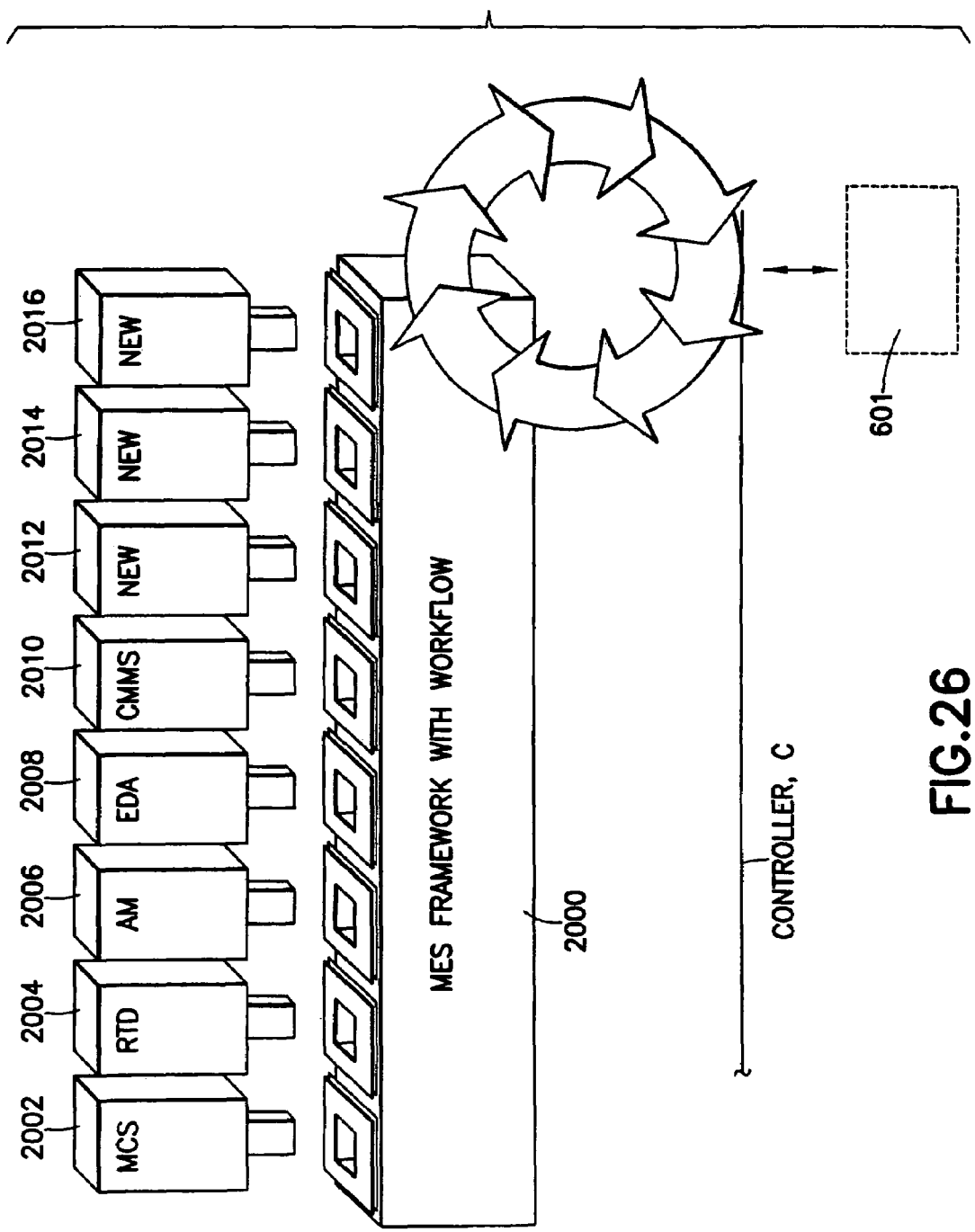
FIG. 26 is a schematic diagram of system control software in the controller of the apparatus.

Systems, such as those shown in FIGS. 2-7, may be controlled by configurable and scaleable software stored in controller C. Referring now also to FIG. 26, there is shown manufacturing execution ("MES") system software that may be provided in the controller C communicably connected to the processing system. The MES system 2000 comprises software modules 2002-2016 or options that enhance the capabilities of the MES. The modules include a material control system ("MCS) 2002, a real time dispatcher ("RTD") 2004, a workflow or activity manager ("AM") 2006, an engineering data manager ("EDA") 2008 and a computer maintenance management system ("CMMS") 2010. The MES 2002 allows manufacturers to configure their factory resources and process, plans, track inventory and orders, collect and analyze production data, monitor equipment, dispatch work orders to manufacturing operators, and trace consumption of components into finished products. The MCS software module 2002 allows the manufacturer to efficiently schedule individual carts (for example, carts 22, 122A, 406, 228, 700, 1557 in FIGS. 2-3, 7-7A, 12, 13A and 22) to arrive at the processing tools to maximize overall system efficiency. The MCS schedules when an individual cart will arrive at, and depart from, a specified processing tool (for example, process 18A, 18B in FIG. 7, and modules 602-626 in FIG. 7A). The MCS manages any queuing and routing requirements at each processing tool and optimizes the system yield while minimizing the cart transport cycle time. The RTD 2004 allows manufacturers to make cart routing decisions, in real time, based on feed back from the health of the processing tools. Additionally, cart routing decisions may be made by the MES operator. The MES operator may change the priority in which specific products need to be manufactured. The AM 2006 allows manufacturers to monitor the progress of any given cart containing one or more substrates though the entire manufacturing process. If a processing tool generates an error, the AM 2006 determines the best remaining route for the all the substrates being processed at the processing tool. The EDA 2008 allows manufactures to analyze the manufacturing data and execute statistical process control algorithms on that data in an effort to improve the efficiency of the processing tool. The CMMS 2010 system allows the manufacturer to predict when maintenance is required on an individual processing tool. Variances in the process of the processing tool is monitored and compared against known process results and changes to the process or scheduled repairs to the processing tool is predicted.

It should be understood that the foregoing description is only, illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A substrate processing apparatus comprising:
   a transport chamber capable of holding an isolated atmosphere isolated from atmosphere exterior to the transport chamber;
   at least one substrate holding module for holding a substrate, the at least one holding module being communicably connected to the transport chamber for allowing transfer of the substrate between the at least one holding module and transport chamber;
a transport vehicle movably mounted in the transport chamber, the vehicle having a base and a substrate transfer arm that is movably jointed and movably mounted to the base; and
another module capable of holding the substrate and communicably connected to the transport chamber for transferring the substrate therebetween,
wherein the transport chamber defines a linear travel slot for the vehicle, the at least one holding module being located on one side of the slot, and the arm having articulation for moving a substrate to opposite sides of the slot allowing the other module to be selectably connected to the transport chamber on either side of the slot, wherein the transport vehicle can effect transfer of the substrate between the transport chamber and both the at least one holding module and the other module wherein the linear motor is connected to the arm for rotating the arm relative to the base and articulating the arm in opposite directions.

2. The apparatus according to claim 1, wherein the at least one holding module is a substrate processing chamber module, and the other module is a load lock chamber module.

3. The apparatus according to claim 1, wherein the at least one holding module is a load lock chamber module, and the other module is another load lock chamber module.

4. The apparatus according to claim 1, wherein the at least one holding module is a substrate processing chamber module, and the other module is another substrate processing chamber module.

5. The apparatus according to claim 1, wherein the other module can be connected to an end of the transport chamber.

6. The apparatus according to claim 1, wherein the transport chamber extends between the at least one holding module and the other module, when the other module is connected on an opposite side of the slot from the at least one holding module.

7. The apparatus according to claim 1, wherein the arm is rotatable relative to the base of the transport vehicle.

8. The apparatus according to claim 1, further comprising a linear motor connected to the transport chamber for driving the transport vehicle.

9. A substrate processing apparatus comprising:
a linear transport chamber capable of holding an isolated atmosphere therein, the isolated atmosphere in the chamber being isolated from atmosphere outside the chamber, and having substrate transfer openings;
at least one processing module for processing a substrate, the at least one processing module being communicably connected to a side of the chamber for allowing transfer, through the transfer openings, of the substrate between the at least one processing module and transport chamber;
another module capable of holding the substrate therein and being selectably connected to either the same side of the chamber as the at least one processing module or to an opposite side of the chamber; and
a transport vehicle movably mounted in the chamber to travel linearly in the transport chamber, the vehicle having a base and a jointed substrate transfer arm movably mounted to the base and having a reach so that the vehicle is capable of transferring the substrate between the transfer chamber and both the at least one processing module and the other module,
wherein the chamber has at least one of a minimum chamber width, or a minimum substrate transfer opening width for the given reach of the substrate transfer arm further comprising a linear motor connected to the transport chamber for driving the transport vehicle and for effecting multi-axis movement of the transfer arm.

10. The apparatus according to claim 9, wherein at least one of the substrate transfer openings has a door that closes and opens the at least one opening.

11. The apparatus according to claim 10, wherein when the at least one opening is closed, the transport chamber is isolated from an environment in the at least one processing module.

12. The apparatus according to claim 10, wherein when the at least one opening is closed, the transport chamber has an environment different than the other module.

13. The apparatus according to claim 9, wherein the transport chamber has a generally tubular shape defining a substantially linear travel path for the transport vehicle.

14. The apparatus according to claim 9, wherein the transport chamber has a general tube shape with elongated lateral sides, the other module being connected to one of the lateral sides.

15. The apparatus according to claim 9, wherein the linear motor is a solid state motor.

16. The apparatus according to claim 9, wherein the linear motor is mounted along at least a portion of the transport chamber and is mounted along at least another portion of the other module.

17. A semiconductor workpiece processing apparatus comprising:
a first chamber capable of being isolated from an outside atmosphere;
a transport vehicle in the first chamber and movably supported from the first chamber for moving linearly relative to the first chamber, the transport vehicle including a base and an integral semiconductor workpiece transfer arm movably mounted to the base and capable of multi-axis movement relative to the base; and
another chamber communicably connected to the first chamber via a closable opening of the first chamber, the opening being configured to enable the transport vehicle to transit between the first chamber and the other chamber through the opening.

18. The apparatus according to claim 17, wherein the opening has a door that closes and opens the opening.

19. The apparatus according to claim 17, wherein when the opening is closed, the first chamber is isolated from an environment in the other chamber.

20. The apparatus according to claim 17, wherein the first chamber has a generally tubular shape defining a substantially linear travel path for the transport vehicle.

21. The apparatus according to claim 17, wherein the first chamber and the other chamber define a substantially linear travel path for the transport vehicle.

22. The apparatus according to claim 17, wherein when the opening is closed, the first chamber has an environment different than the other chamber.

23. The apparatus according to claim 17, wherein the first chamber has a general tube shape with elongated lateral sides, the other chamber being connected to one of the lateral sides.

24. The apparatus according to claim 17, wherein the base of the transport vehicle interacts with at least one wall of the first chamber to movably support the transport vehicle from the first chamber.

25. The apparatus according to claim 17, further comprising a linear motor connected to the first chamber for driving the transport vehicle and for effecting multi-axis movement of the transfer arm, and wherein the linear motor is a solid state motor.

26. The apparatus according to claim 15, wherein the linear motor extends along at least a portion of the first chamber and along at least another portion of the other chamber.

27. The apparatus according to claim 25, wherein the linear motor comprises a forcer component and a reaction component, the forcer component being mounted to the first chamber so that the forcer component is isolated from an environment in the first chamber.

28. The apparatus according to claim 27, wherein the reaction component is mounted on the transport vehicle, and the forcer component is mounted on a vertical wall of the first chamber, and wherein when the reaction component is de-energized, the reaction component reacts with the vertical wall of the first chamber to stably support the transport vehicle in the first chamber.

29. The apparatus according to claim 17, wherein the transfer arm has an end effector for holding a semiconductor workpiece thereon, and the transfer arm is movably jointed so that the arm is capable of moving the semiconductor workpiece in opposite directions from opposite sides of the first chamber.

30. The apparatus according to claim 29, wherein the transfer arm is capable of rotation relative to the base about a first axis, and is capable of moving the end effector along a radial axis relative to the base.

31. The apparatus according to claim 17, further comprising yet another chamber communicably connected to the first chamber to allow transfer of a semiconductor workpiece between the yet another chamber and the first chamber, the yet another chamber being at least one of an front end module, a semiconductor workpiece holding module, or a semiconductor workpiece processing module.

32. The apparatus according to claim 17, wherein the other chamber is at least one of a semiconductor workpiece holding chamber or a semiconductor workpiece processing chamber, the semiconductor workpiece processing chamber being at least one of lithography module, a metal deposition module, an etching module, or a heating or cooling module.

33. The apparatus according to claim 17, wherein the other chamber is a stocker for stocking semiconductor workpiece transport containers therein.

34. The apparatus according to claim 17, wherein the other chamber is a load lock chamber.

35. The apparatus according to claim 20, wherein the other chamber is a front end module providing an interface between the semiconductor workpiece transport containers and the first chamber.

36. A substrate processing apparatus comprising:
   a transport chamber capable of having a controlled atmosphere therein;
   at least one substrate holding module for holding a substrate, the at least one holding module being communicably connected to the transport chamber for allowing transfer of the substrate between the at least one holding module and transport chamber;
   a first transport vehicle movably mounted in the transport chamber, the first vehicle having a first movable substrate transfer arm adapted for moving the substrate between the transport chamber and the at least one substrate holding module; and
   a second transport vehicle movably mounted in the transport chamber, the second vehicle having a second movable substrate transfer arm adapted for moving the substrate between the transport chamber and the at least one substrate holding module;
   wherein the transport chamber has a section defining a tube and has several linear travel paths between opposing walls of the tube for the first and second vehicles to travel in the transport chamber, and wherein the first vehicle extends across the tube from proximate one of the opposing walls to proximate another of the opposing walls and the first and second vehicles are capable of moving past one another between the opposing walls of the tube when the first vehicle is using one of the travel paths and the second vehicle is using another of the travel paths.

37. The apparatus according to claim 36, wherein the travel paths are generally aligned with each other.

38. The apparatus according to claim 36, wherein the travel paths extend longitudinally in the transport chamber.

* * * * *

UNITED STATES PATENT AND TRADEMARK OFFICE
CERTIFICATE OF CORRECTION

| | | |
|---|---|---|
| PATENT NO. | : 7,575,406 B2 | Page 1 of 1 |
| APPLICATION NO. | : 10/624987 | |
| DATED | : August 18, 2009 | |
| INVENTOR(S) | : Hofmeister et al. | |

It is certified that error appears in the above-identified patent and that said Letters Patent is hereby corrected as shown below:

Column 23, line 4, in Claim 26, delete "15," and insert --25,--, therefor.

Column 24, line 6, in Claim 35, delete "20," and insert --17,--, therefor.

Signed and Sealed this

Ninth Day of November, 2010

David J. Kappos
*Director of the United States Patent and Trademark Office*